United States Patent
Cho et al.

(10) Patent No.: US 7,585,718 B2
(45) Date of Patent: *Sep. 8, 2009

(54) METHOD OF MANUFACTURING A CARBON NANO-TUBE TRANSISTOR

(75) Inventors: Hong Cho, Gyeonggi-do (KR); Seung-Pil Chung, Seoul (KR); Hong Sik Yoon, Seoul (KR); Kyung-Rae Byun, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/932,994

(22) Filed: Oct. 31, 2007

(65) Prior Publication Data

US 2008/0138991 A1 Jun. 12, 2008

Related U.S. Application Data

(63) Continuation-in-part of application No. 11/832,592, filed on Aug. 1, 2007.

(30) Foreign Application Priority Data

Aug. 2, 2006 (KR) ............................... 2006-72907

(51) Int. Cl.
*H01L 21/336* (2006.01)
*H01L 21/335* (2006.01)
(52) U.S. Cl. ............................... 438/197; 257/E51.038; 257/E51.039; 257/E51.04; 257/E23.074; 257/E23.165
(58) Field of Classification Search .......... 257/E39.001, 257/E51.038–E51.04, E23.074, E23.165, 257/9, 296; 438/243, 583, 584, 197; 174/256
See application file for complete search history.

(56) References Cited

U.S. PATENT DOCUMENTS

2005/0095780 A1 5/2005 Gutsche et al.
2006/0249726 A1* 11/2006 Choi et al. ..................... 257/9

FOREIGN PATENT DOCUMENTS

| EP | 1804286 A1 * | 7/2007 |
| JP | 2004-103802 | 4/2004 |
| KR | 2002-0001260 | 1/2002 |
| KR | 10-2004-0043043 | 5/2004 |

OTHER PUBLICATIONS

English language abstract of Korean Publication No. 2002-0001260.
English language abstract of Japanese Publication No. 2004-103802.
English language abstract of Korean Publication No. 10-2004-0043043.

* cited by examiner

*Primary Examiner*—Matthew C Landau
*Assistant Examiner*—Jessica Hall
(74) *Attorney, Agent, or Firm*—Marger Johnson & McCollom, P.C.

(57) ABSTRACT

A multilayer insulating structure including a first stop layer, a first insulating layer and a second stop layer is formed on the first conductive structure. A second conductive structure and a second insulating layer are formed on the first conductive structure. The second insulating layer and the second conductive structure are etched to form a first hole and a second hole having a first radius. A spacer is formed on sidewalls of the first and second holes. The second stop layer and the first insulating layer are etched using the spacer as an etch mask to form a third hole having a second radius smaller than the first radius. A sacrificial filler is formed on the first stop layer to fill the third hole. After removing the spacer, the sacrificial filler is removed. The first stop layer is etched. A carbon nano-tube is grown from the first conductive structure.

20 Claims, 41 Drawing Sheets

US 7,585,718 B2

METHOD OF MANUFACTURING A CARBON NANO-TUBE TRANSISTOR

CROSS-REFERENCE TO RELATED APPLICATION

This application is a Continuation-In-Part of U.S. patent application Ser. No. 11/832,592, entitled "A TRANSISTOR AND ITS METHOD OF MANUFACTURE," filed on Aug. 1, 2007. This application claims priority under 35 U.S.C. § 119 to Korean Patent Application No. 2006-72907 filed on Aug. 2, 2006, the contents of which are herein incorporated by reference in their entirety.

BACKGROUND OF THE INVENTION

1. Field of the Invention

Example embodiments of the present invention relate to a method of manufacturing a transistor. More particularly, example embodiments of the present invention relate to a method of manufacturing a transistor including a carbon nano-tube transistor.

2. Description of the Related Art

A recently discovered method for forming a carbon nano-tube having beneficial properties such as a relatively high electrical conductivity incorporates a chemical vapor deposition (CVD) process. The discovery has triggered research on methods of manufacturing a transistor having the carbon nano-tube.

For example, conventional transistors having a carbon nano-tube are disclosed in Japanese Patent Laid-open Publication No. 2004-0103802, Korean Patent Laid-open Publication No. 2002-0001260 and Korean Patent Laid-open Publication No. 2004-0043043.

The transistor employing the carbon nano-tube may have various operation methods. As one example, the transistor may operate by using an elasticity of the carbon nano-tube. Particularly, a state where a carbon nano-tube fixed to a first conductive structure is attached to a second conductive structure, and a state where the carbon nano-tube fixed to the first conductive structure is spaced apart from the second conductive structure are defined as an "on" state and an "off" state, respectively. The transistor may have a switching function by using a difference between the "on" state and the "off" state.

In the above operation method using the elasticity of the carbon nano-tube, a method of forming a space between the second conductive structure and the carbon nano-tube is an important topic of research. Thus, a new method of forming the space has been widely researched.

SUMMARY OF THE INVENTION

Example embodiments of the present invention provide a method of manufacturing a transistor employing a carbon nano-tube.

According to one aspect of the present invention, there is provided a transistor. The transistor includes a first insulating layer pattern, a second conductive structure pattern, a second insulating layer pattern and at least one carbon nano-tube. The first insulating layer pattern is provided on a first conductive structure. The first insulating layer pattern defines a first hole exposing the first conductive structure. The first hole has a first radius. The second conductive structure pattern is provided on the first insulating layer pattern. The second conductive structure pattern defines a second hole communicating with the first hole. The second hole has a second radius substantially larger than the first radius. The second insulating layer pattern is provided on the first insulating layer pattern and the second conductive structure pattern. The second insulating layer pattern defines a third hole communicating with the second hole. The third hole has the second radius. The carbon nano-tube vertically grows from a portion of the first conductive structure exposed through the first hole.

According to another aspect of the present invention, there is provided a transistor. The transistor includes a first insulating layer, a second insulating layer pattern, a first conductive structure pattern, a third insulating layer pattern, at least one carbon nano-tube and a second conductive structure. The second insulating layer pattern is provided on the first insulating layer. The second insulating layer pattern defines a first hole exposing the first insulating layer. The first hole has a first radius. The first conductive structure pattern is provided on the second insulating layer pattern. The first conductive structure pattern defines a second hole having a second radius substantially larger than the first radius. The third insulating layer pattern is provided on the second insulating layer pattern and the first conductive structure pattern. The third insulating layer pattern defines a third hole communicating with the first hole. The third hole has a second radius. The carbon nano-tube vertically grows from a portion of the first insulating layer exposed through the first hole. The second conductive structure is provided on the third insulating layer pattern to fix an upper end of the carbon nano-tube.

According to still another aspect of the present invention, there is provided a method of manufacturing a transistor. In the method of manufacturing the transistor, a first insulating layer is formed on a first conductive structure. A second conductive structure is formed on the first insulating layer. A second insulating layer is formed on the first insulating layer and the second conductive structure. The second insulating layer and the second conductive structure are etched to form a second insulating layer pattern and a second conductive structure pattern. The second insulating layer pattern defines a first hole having a first radius. The second conductive structure pattern defines a second hole having the first radius. A spacer is formed on inner walls of the first hole and the second hole. An etching process is performed on the first insulating layer by using the spacer as an etch mask to form a first insulating layer pattern defining a third hole communicating with the second hole. The third hole has a second radius substantially smaller than the first radius. The spacer is removed. At least one carbon nano-tube is allowed to vertically grow from a portion of the first conductive structure exposed through the first hole.

According to still another aspect of the present invention, there is provided a method of manufacturing a transistor. In the method of manufacturing the transistor, a first insulating layer and a second insulating layer are subsequently formed. A first conductive structure is formed on the second insulating layer. A third insulating layer is formed on the second insulating layer and the first conductive structure. The third insulating layer and the first conductive structure are etched to form a third insulating layer pattern and a first conductive structure pattern. The third insulating layer pattern defines a first hole having a first radius. The first conductive structure pattern defines a second hole communicating with the first hole. The second hole has the first radius. A spacer is formed on inner walls of the first hole and the second hole. An etching process is performed on the second insulating layer by using the spacer as an etch mask to form a second insulating layer pattern defining a third hole communicating with the second hole. The third hole has a second radius substantially smaller than the first radius. The spacer is removed. At least one carbon nano-tube is allowed to vertically grow from a portion of the first insulating layer exposed through the third hole. A second conductive structure is formed on the third insulating layer pattern to fix an upper end of the carbon nano-tube.

According to still another aspect of the present invention, there is a method of manufacturing a transistor. In the method of manufacturing the transistor, a multilayer insulating structure is formed on a first conductive structure. The multilayer insulating structure includes a first etch-stop layer, a first insulating layer and a second etch-stop layer sequentially stacked on the first conductive structure. A second conductive structure is formed on the multilayer insulating structure. A second insulating layer is formed on the second conductive structure and the multilayer insulating structure. The second insulating layer and the second conductive structure are etched to form a second insulating layer pattern and a second conductive structure pattern, respectively. The second insulating layer pattern defines a first hole having a first radius, and the second conductive structure pattern defines a second hole having the first radius. A spacer is formed on sidewalls of the first and second holes to partially cover the multilayer insulating structure. The second etch-stop layer and the first insulating layer are etched using the spacer as an etch mask to form a second etch-stop layer pattern and a first insulating layer pattern, respectively. The second etch-stop layer pattern together with the first insulating layer pattern define a third hole communicating with the second hole. The third hole has a second radius substantially smaller than the first radius. A sacrificial filler is formed on the first etch-stop layer to fill up the third hole. The spacer is removed. The sacrificial filler is removed. The first etch-stop layer is etched to form a first etch-stop layer pattern defining a fourth hole communicating with the third hole. The fourth hole has the second radius. A carbon nano-tube is grown from a portion of the first conductive structure exposed through the fourth hole.

In an example embodiment of the present invention, when the sacrificial filler is formed on the first etch-stop layer, a sacrificial layer may be formed on the first etch-stop layer, the spacer and the second insulating layer pattern to fill up the third hole and remaining portions of the first and second holes. An upper portion of the sacrificial layer may be removed to form the sacrificial filler.

In an example embodiment of the present invention, the upper portion of the sacrificial layer may be removed by an etch-back process.

In an example embodiment of the present invention, the sacrificial filler may be formed using a carbon-containing silicon oxide.

In an example embodiment of the present invention, the second etch-stop layer may be formed using a material having an etching selectivity with respect to the second conductive structure, and the first etch-stop layer may be formed using a material having an etching selectivity with respect to the first insulating layer.

In an example embodiment of the present invention, the second conductive structure may be formed using titanium nitride and the second etch-stop layer may be formed using aluminum oxide ($Al_2O_3$).

In an example embodiment of the present invention, the first and second etch-stop layers may be formed using substantially the same material.

In an example embodiment of the present invention, the first and second etch-stop layers may be formed using silicon nitride, and the first insulating layer may be formed using silicon oxide.

In an example embodiment of the present invention, the first etch-stop layer may be formed using silicon nitride, and the first etch-stop layer may be etched using carbon tetrafluoride ($CF_4$), trifluoromethane ($CHF_3$), difluoromethane ($CH_2F_2$), etc.

In an example embodiment of the present invention, when the spacer is formed on the sidewalls of the first and second holes, a spacer layer may be formed on the multilayer insulating structure and the second insulating layer pattern to fill up the first and second holes. The spacer layer may be anisotropically etched to form the spacer partially covering the multilayer insulating structure.

In an example embodiment of the present invention, the spacer may be removed by a wet etching process using *Limulus Amebocyte* Lysate (LAL) solution.

In an example embodiment of the present invention, a first seed layer for growing the carbon nano-tube may be further formed on the first conductive structure, before the multilayer insulating structure is formed on the first conductive structure.

In an example embodiment of the present invention, a second seed layer for growing the carbon nano-tube may be further formed on the portion of the first conductive structure after etching the first etch-stop layer.

In an example embodiment of the present invention, a capping layer may be further formed on the second insulating layer pattern to fix an upper end of the carbon nano-tube.

According to still another aspect of the present invention, there is provided a method of manufacturing a transistor. In the method of manufacturing the transistor, a multilayer insulating structure is formed on a first conductive structure. The multilayer insulating structure includes a first etch-stop layer, a first insulating layer and a second etch-stop layer sequentially stacked on the first conductive structure. A second conductive structure is formed on the multilayer insulating structure. A second insulating layer is formed on the second conductive structure and the multilayer insulating structure. The second insulating layer and the second conductive structure are etched to form a second insulating layer pattern and a second conductive structure pattern, respectively. The second insulating layer pattern defines a first hole having a first radius, and the second conductive structure pattern defines a second hole having the first radius. A spacer is formed on sidewalls of the first and second holes to partially cover the multilayer insulating structure. The second etch-stop layer and the first insulating layer are etched using the spacer as an etch mask to form a second etch-stop layer pattern and a first insulating layer pattern, respectively. The second etch-stop layer pattern together with the first insulating layer pattern define a third hole communicating with the second hole. The third hole has a second radius substantially smaller than the first radius. The first etch-stop layer is etched to form a first etch-stop layer pattern defining a fourth hole communicating with the third hole. The fourth hole has the second radius. A sacrificial filler is formed on the first conductive structure to fill up the third and fourth holes. The spacer is removed. The sacrificial filler is removed. A carbon nano-tube is grown from a portion of the first conductive structure exposed through the fourth hole. In an example embodiment of the present invention, when the sacrificial filler is formed on the first conductive structure, a sacrificial layer may be formed on the first conductive structure, the spacer and the second insulating layer pattern to fill up the third and fourth holes and remaining portions of the first and second holes. An upper portion of the sacrificial layer may be removed to form the sacrificial filler.

According to still another aspect of the present invention, there is a method of manufacturing a transistor. In the method of manufacturing the transistor, a multilayer insulating structure is formed on a first conductive structure. The multilayer insulating structure includes a first etch-stop layer, a first insulating layer and a second etch-stop layer sequentially stacked on the first conductive structure. A second conductive structure is formed on the multilayer insulating structure. A second insulating layer is formed on the second conductive structure and the multilayer insulating structure. The second insulating layer and the second conductive structure are etched to form a second insulating layer pattern and a second conductive structure pattern, respectively. The second insulating layer pattern defines a first hole having a first radius, and the second conductive structure pattern defines a second hole having the first radius. A spacer is formed on sidewalls of the first and second holes to partially cover the multilayer insulating structure. Portions of the second etch-stop layer and the first insulating layer that are not covered by the spacer are removed until the first etch-stop layer is exposed, thereby forming a second etch-stop layer pattern and a first insulating layer pattern, respectively. The spacer is removed until a portion of the second etch-stop layer pattern is exposed. The second etch-stop layer pattern together with the first insulating layer pattern define a third hole communicating with the second hole. The third hole has a second radius substantially smaller than the first radius. The first etch-stop layer is etched to form a first etch-stop layer pattern defining a fourth hole communicating with the third hole. The fourth hole has the second radius. A carbon nano-tube is grown from a portion of the first conductive structure exposed through the fourth hole.

In an example embodiment of the present invention, the portions of the second etch-stop layer and the first insulating layer and the spacer may be removed by a dry etching process.

In an example embodiment of the present invention the spacer may be formed using a material different from that of the second insulating layer.

In an example embodiment of the present invention, the spacer may be formed using silicon oxide and the second insulating layer is formed using silicon nitride.

According to some example embodiments of the present invention, a space between a carbon nano-tube and a conductor is formed by removing a spacer, so that process stability may be achieved. Additionally, a dimension of the spacer between the carbon nano-tube and the conductor may be efficiently controlled by adjusting a width of the spacer, so that an operation voltage relating to the dimension of the space may be efficiently controlled. Furthermore, the spacer may be easily removed without damaging other layers by forming a sacrificial filler.

BRIEF DESCRIPTION OF THE DRAWINGS

The above and other advantages of the present invention will become readily apparent by reference to the following detailed description when considered in conjunction with the accompanying drawings in which.

DESCRIPTION OF THE EMBODIMENTS

Figure 1:
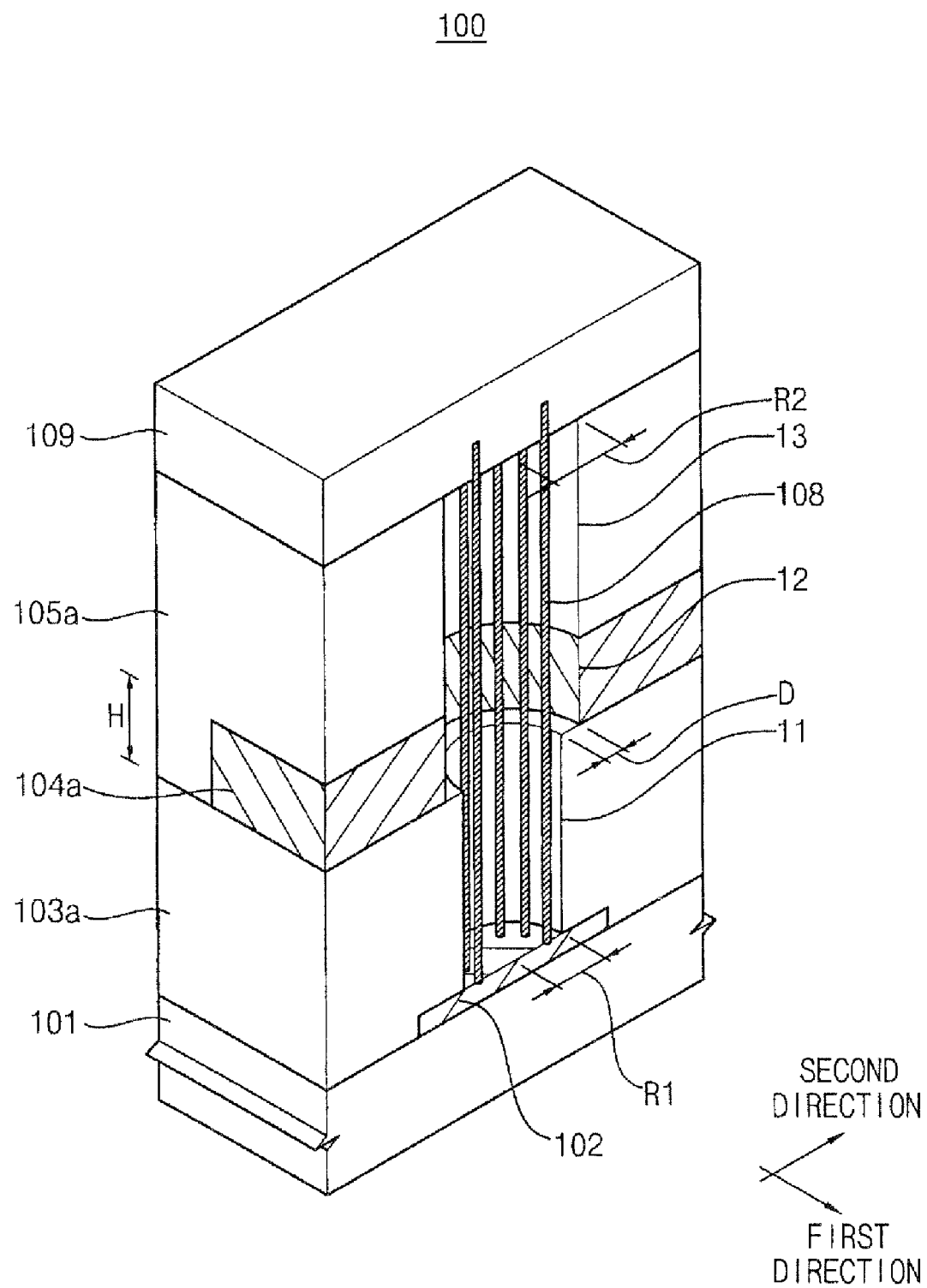
FIG. 1 is a partially cut perspective view illustrating a transistor in accordance with an example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a partially cut perspective view illustrating a transistor in an example embodiment of the present invention.

Referring to FIG. 1, a transistor 100 includes a first insulating layer 101, a first conductive structure 102, a second insulating layer pattern 103a, a second conductive structure pattern 104a, a third insulating layer pattern 105a, at least one carbon nano-tube 108 and a capping layer 109.

The first insulating layer 101 may include an insulating material such as silicon nitride. The first conductive structure 102 may include a conductive material such as a metal, an alloy or doped polysilicon. Additionally, the first conductive structure 102 may have a substantially linear shape extending in a first direction, which is denoted in FIG. 1.

A seed required for growing the carbon nano-tube 108 is provided on the first conductive structure 102. The seed may have a substantial film shape, i.e., be relatively thin compared to its horizontal extent. Alternatively, the seed may be particles having nano sizes. For example, the seed may include nickel (Ni), iron (Fe), cobalt (Co), or an alloy of these elements.

The second insulating layer pattern 103a including an insulating material such as silicon oxide is provided on the first insulating layer 101 and the first conductive structure 102. The second insulating layer pattern 103a may define a first hole 11 exposing the first conductive structure 102. The first hole 11 may have a first radius R1.

The second conductive structure pattern 104a may be provided on the second insulating layer pattern 103a. Additionally, the third insulating layer pattern 105a including an insulating material such as silicon oxide may be formed on the second insulating layer pattern 103a and the second conductive structure pattern 104a.

The second conductive structure pattern 104a may include a conductive material such as a metal, an alloy or doped polysilicon. The second conductive structure pattern 104a may extend in a second direction substantially perpendicular to the first direction, as shown in FIG. 1. The second conductive structure pattern 104a may have a predetermined height H.

The second conductive structure pattern 104a may define a second hole 12 communicating with the first hole 11. The second hole 12 may have a second radius R2. The second radius R2 is larger than the first radius R1 by about a predetermined width D.

Figure 2:
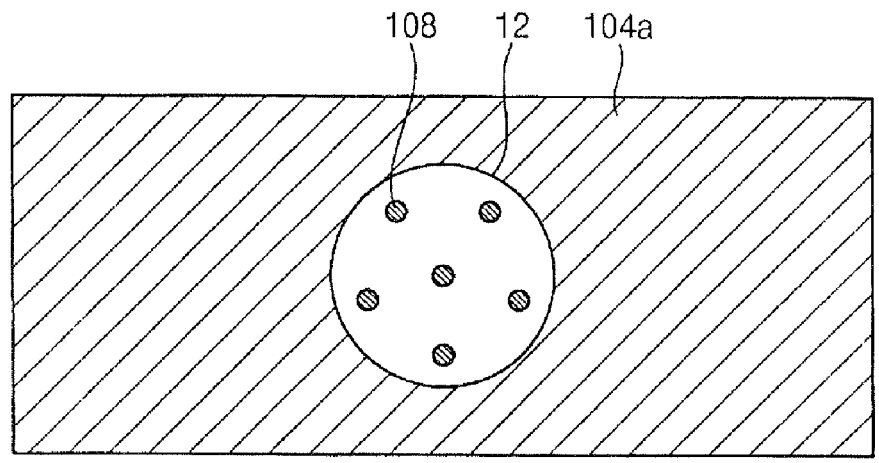
FIGS. 2 and 3 are cross-sectional views of the transistor in FIG. 1 taken in parallel with first and second directions.
Figure 3:
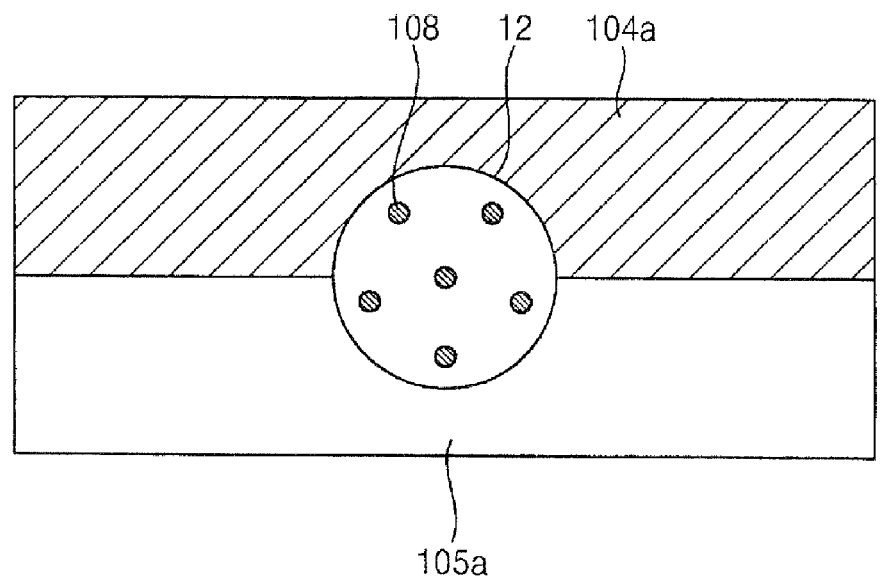

FIGS. 2 and 3 are cross-sectional views of the transistor in FIG. 1 taken in parallel with first and second directions. Particularly, FIGS. 2 and 3 may illustrate locations of the second conductive structure pattern 104a and the second hole 12.

Referring to FIG. 2, the second conductive structure pattern 104a may fully enclose the second hole 12. In this case, the second hole 12 may be provided through a central portion of the second conductive structure pattern 104a.

Alternatively, referring to FIG. 3, the second conductive structure pattern 104a may partially enclose the second hole 12. For example, the second conductive structure pattern 104a may enclose about half the second hole 12. When the second conductive structure pattern 104a partially encloses the second hole 12, the second conductive structure pattern 104a may have a recessed side portion. In this case, the second conductive structure pattern 104a together with the third insulating layer pattern 105a may define the second hole 12.

When the second conductive structure pattern 104a partially encloses the second hole 12, a magnetic field generated from the second conductive structure pattern 104a may not disturb a movement of the carbon nano-tube 108 that is subsequently formed.

The third insulating layer pattern 105a may define a third hole 13 communicating with the second hole 12. The third hole 13 may have the second radius R2.

The carbon nano-tube 108 may vertically grow from a portion of the first conductive structure 102 exposed through the hole 11. Here, a height of the carbon nano-tube 108 may be substantially larger than that of the third insulating layer pattern 105a.

The carbon nano-tube 108 may be spaced apart from the second conductive structure pattern 104a by a predetermined width D or more.

The capping layer 109 may be provided on the third insulating layer pattern 105a to fix an upper end of the carbon nano-tube 108. The capping layer may include an insulating material. Here, the capping layer 109 is optional. Thus, the capping layer 109 may not be provided.

Hereinafter, a method of manufacturing the transistor 100 in FIG. 1 is illustrated.

FIGS. 4 to 11 are partially cut perspective views illustrating a method of manufacturing the transistor 100 in FIG. 1.

Figure 4:
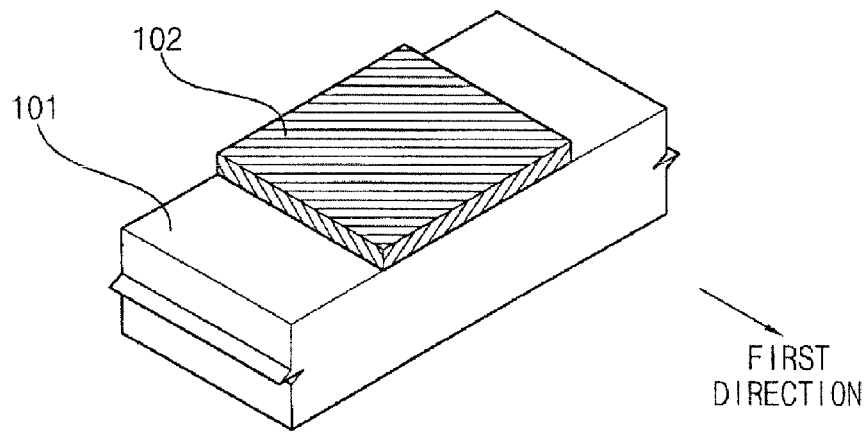
FIGS. 4 to 11 are partially cut perspective views illustrating a method of manufacturing a transistor in accordance with an example embodiment of the present invention.

Referring to FIG. 4, a first insulating layer 101 including an insulating material such as silicon nitride is formed. A first conductive stricture 102 including a conductive material such as a metal, an alloy or doped polysilicon is formed on the first insulating layer 101. The first conductive structure 102 may have a substantially linear shape extending in a first direction.

A seed (not shown) may be formed on the first conductive structure 102. The seed may be required for growing a carbon nano-tube. The seed may be formed substantially in a film. Alternatively, the seed may be particles having nano sizes. For example, the seed may be formed using nickel, iron, cobalt, or an alloy of these elements.

Figure 5:
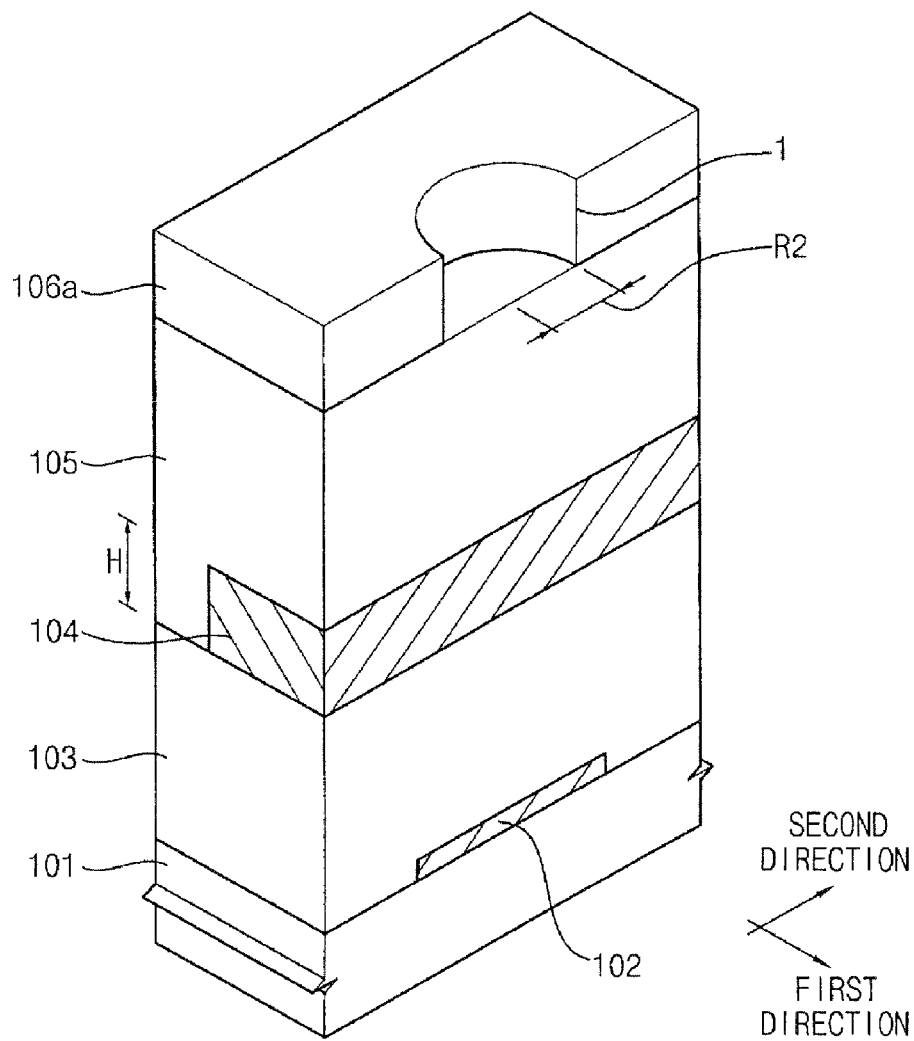

Referring to FIG. 5, a second insulating layer 103 is formed on the first insulating layer 101 and the first conductive structure 102 using an insulating material such as silicon oxide. Thereafter, a second conductive structure 104 is formed on the second insulating layer 103 using a conductive material such as a metal, an alloy or doped polysilicon. The second conductive structure 104 may have a substantially linear shape extending in a second direction substantially perpendicular to the first direction.

Here, the second conductive structure 104 may have a predetermined height H. Thereafter, a third insulating layer 105 is formed on the second insulating layer 103 and the second conductive structure 104 using an insulating material such as silicon oxide.

A mask layer is then formed on the third insulating layer 105 using an insulating material such as silicon nitride. Thereafter, a photolithography process is performed on the mask layer. Thus, the mask layer may be transformed into a mask layer pattern 106a defining an opening 1. Here, the opening 1 may have a second radius R2.

Figure 6:
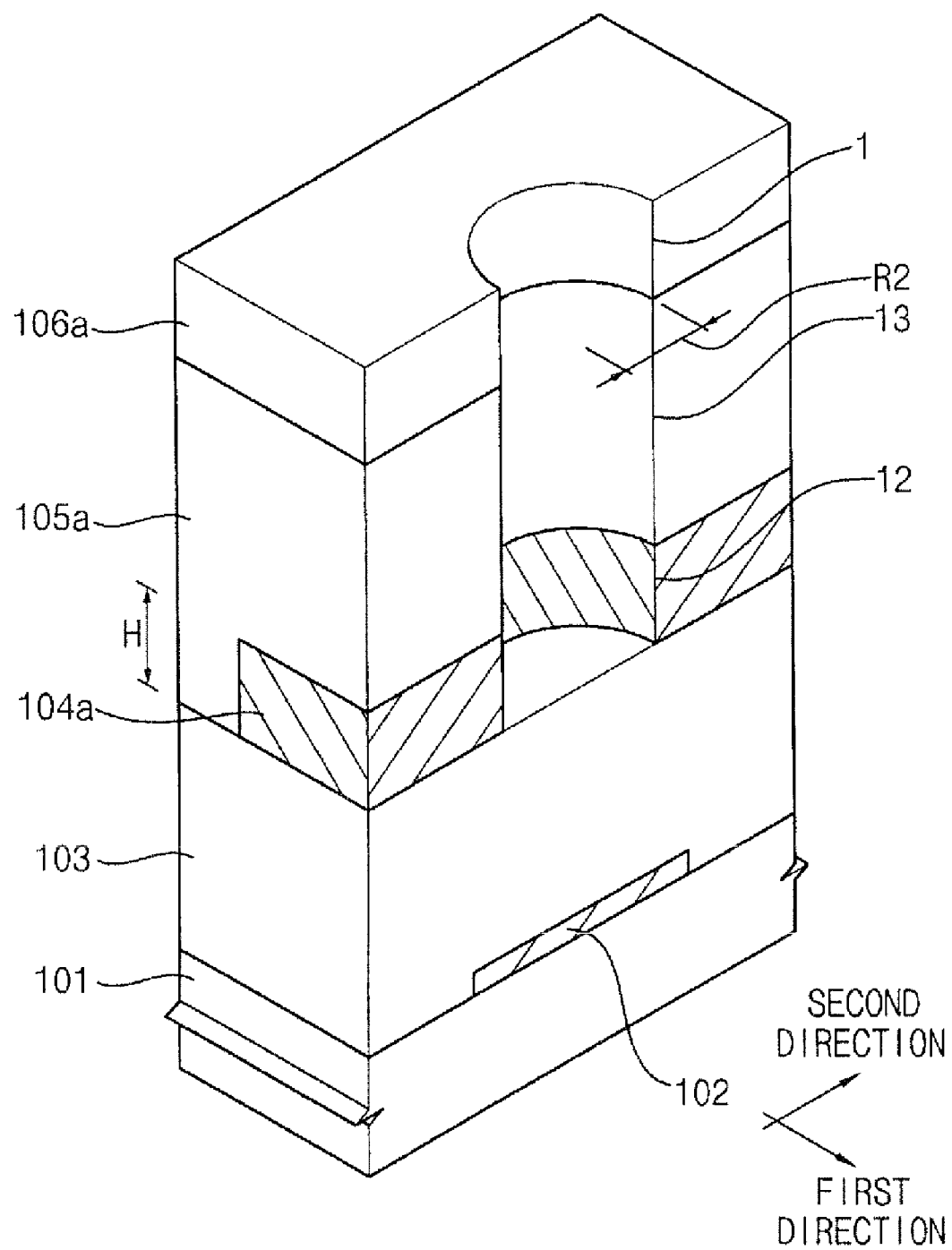

Referring to FIG. 6, the third insulating layer 105 and the second conductive structure 104 are anisotropically etched until the second insulating layer 103 is exposed using the mask layer pattern 106a as an etch mask. Thus, the third insulating layer 105 and the second conductive structure 104 may be transformed into a third insulating layer pattern 105a and a second conductive structure pattern 104a, respectively.

The third insulating layer pattern 105a may define a third hole 13 communicating with the opening 1. The third hole 13 may have the second radius R2. The second conductive structure pattern 104a may define a second hole 12 communicating with the third hole 13. The second hole 12 may have the second radius R2.

Particularly, the second conductive structure pattern 104a may fully enclose the second hole 12. In this case, the second hole 12 may be formed through a central portion of the second conductive structure pattern 104a.

Alternatively, the second conductive structure pattern 104a may partially enclose the second hole 12. For example, the second conductive structure pattern 104a may enclose about half the second hole 12. When the second conductive structure pattern 104a partially encloses the second hole 12, the second conductive structure pattern 104a may have a recessed sidewall. In this case, the second conductive structure pattern 104a and the third insulating layer pattern 105a together may define the second hole 12.

When the second conductive structure pattern 104a partially encloses the second hole 12, a magnetic field generated from the second conductive structure pattern 104a may not disturb a movement of the carbon nano-tube subsequently formed.

Figure 7:
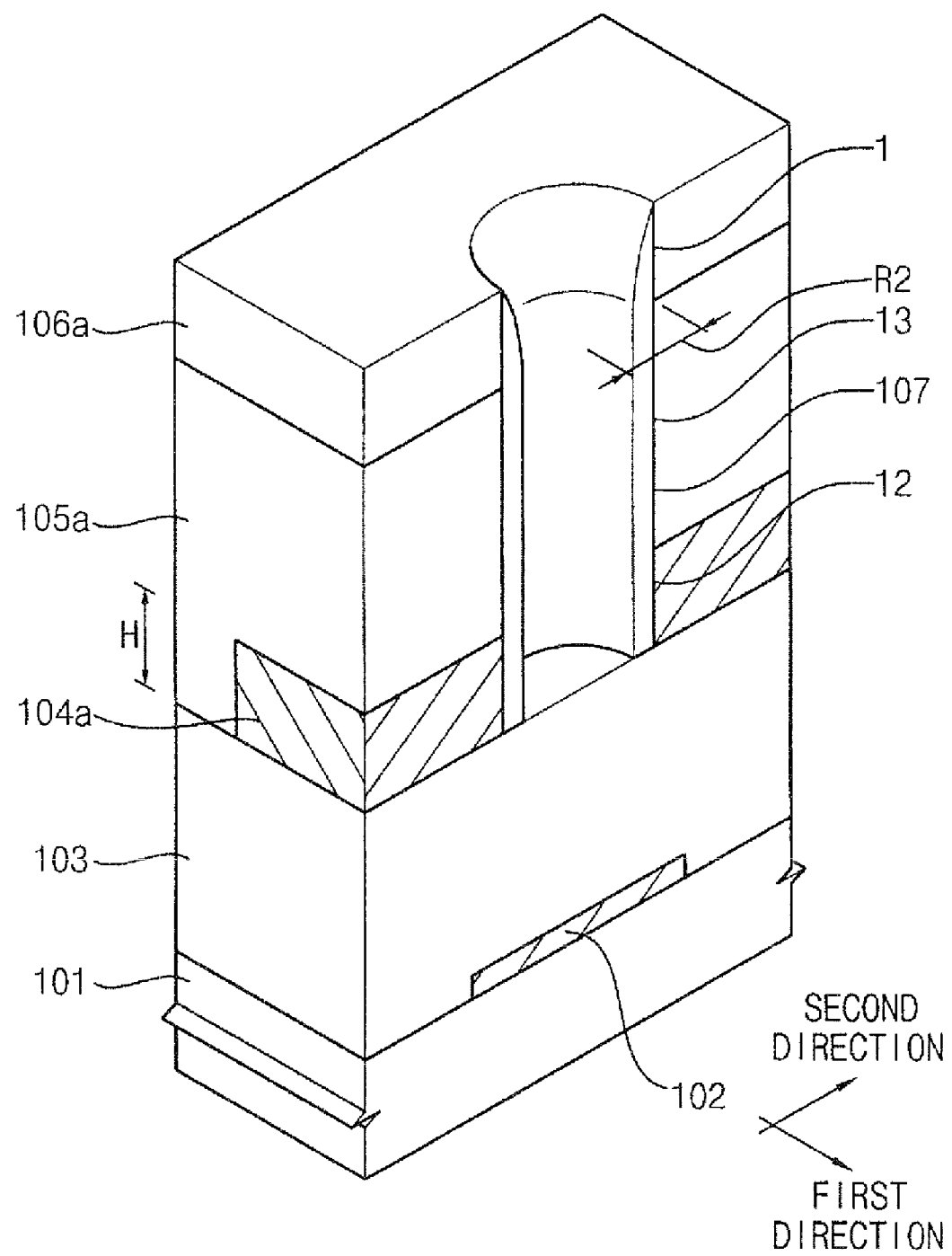

Referring to FIG. 7, an insulating layer (not shown) including an insulating material such as silicon nitride may be formed on the mask layer pattern 106a to fill up the third hole 13 and the second hole 12. Thereafter, the insulating layer may be anisotropically etched. Thus, the insulating layer may be transformed into a spacer 107 located on inner walls of the opening 1, the third hole 13 and the second hole 12. Here, a lower end of the spacer 107 may have a predetermined width D.

Figure 8:
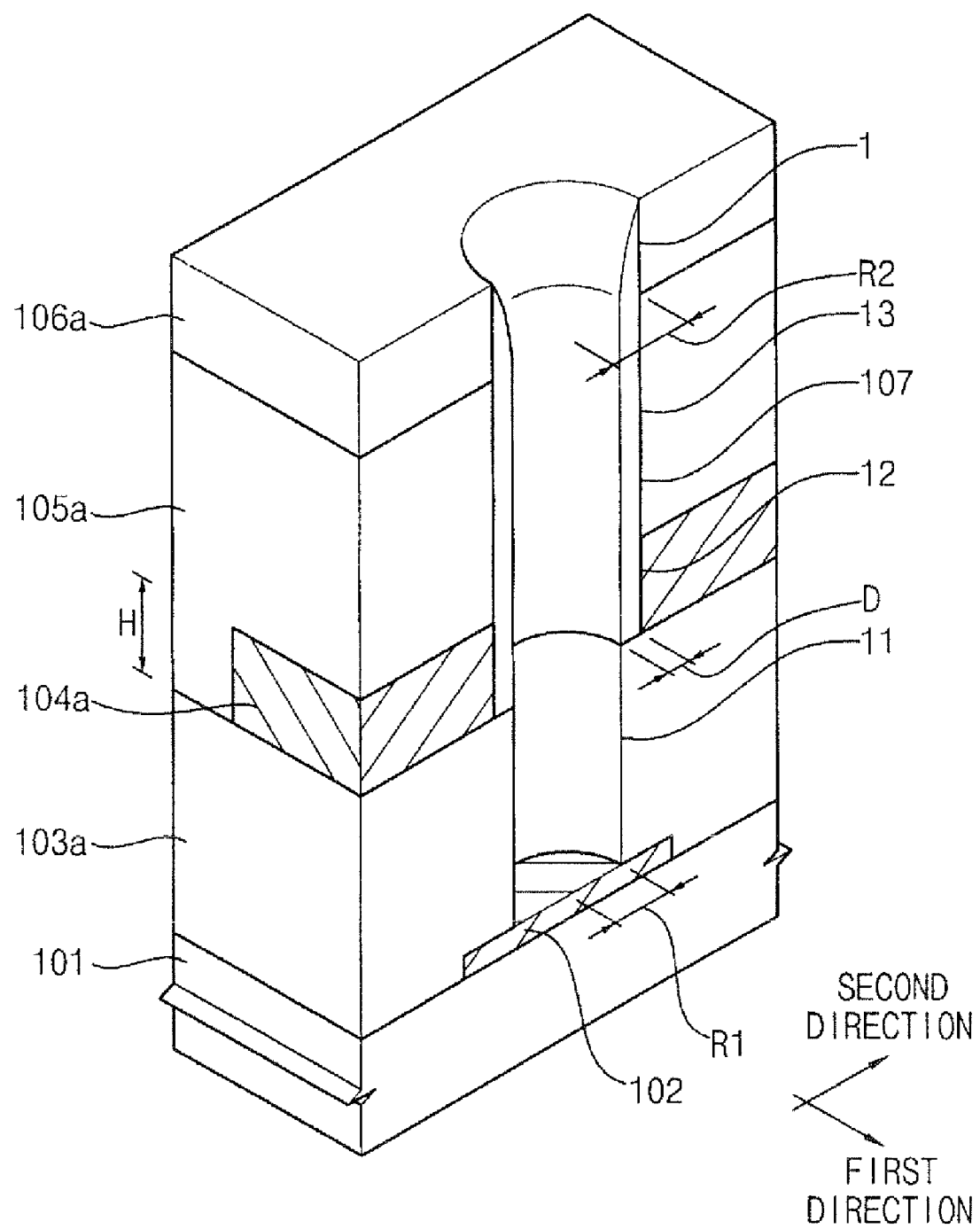

Referring to FIG. 8, the second insulating layer 103 may be anisotropically etched using the mask layer pattern 106a and the spacer 107 together as an etch mask until the first conductive structure 102 is exposed. Thus, the second insulating layer 103 may be transformed into a second insulating layer pattern 103a defining the first hole 11 communicating with the second hole 12. Here, the first hole 11 has a first radius R1 substantially smaller than the second radius R2. Particularly, the first radius R1 may be smaller than the second radius R2 by the width D of the lower end of the spacer 107.

Here, when the seed for growing the carbon nano-tube is not formed on the first conductive structure 102 before the second insulating layer 103 is formed, the seed may be formed on a portion of the first conductive structure 102 exposed through the first hole 11.

Figure 9:
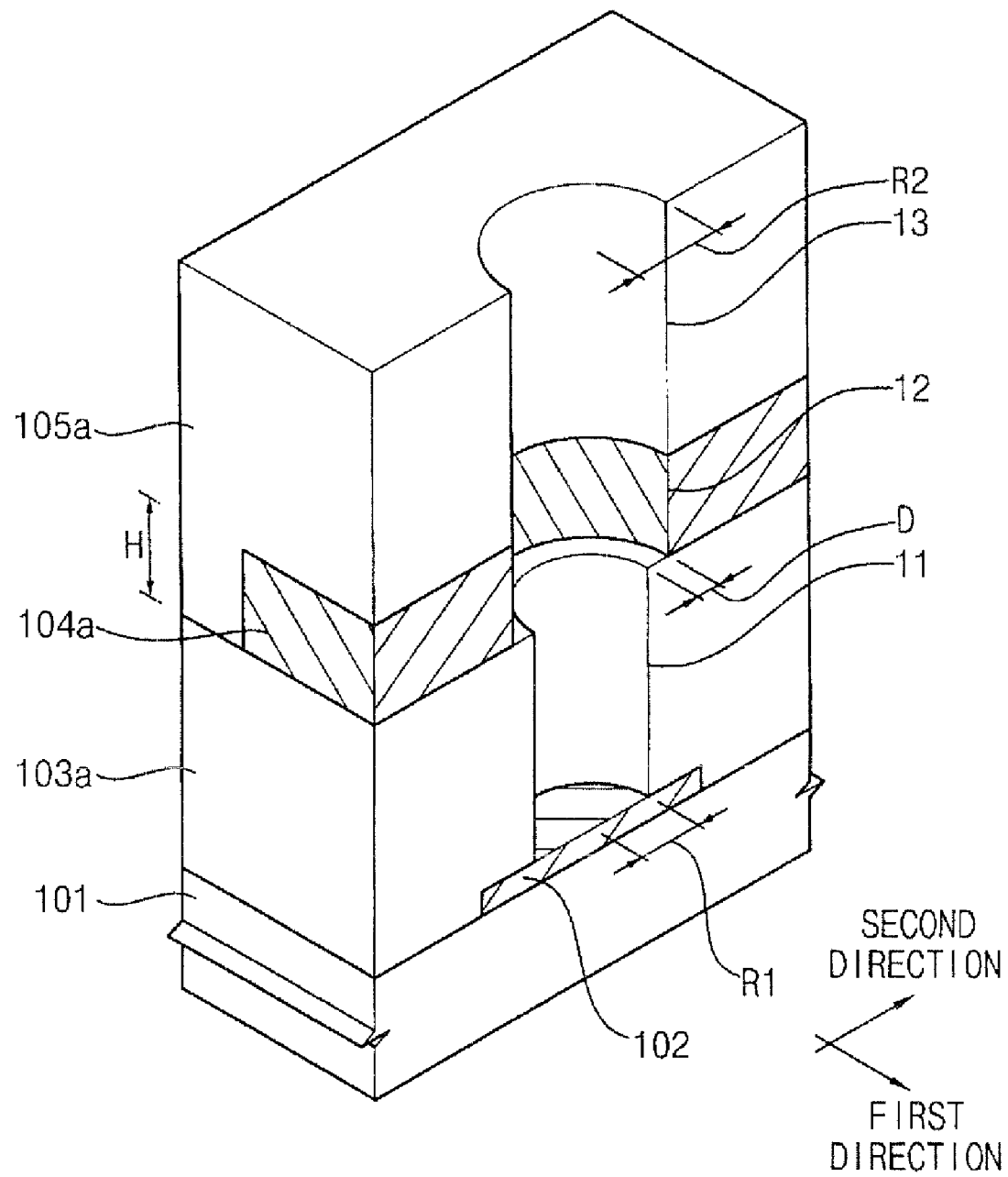

Referring to FIG. 9, the mask layer pattern 106a and the spacer 107 are removed.

Figure 10:
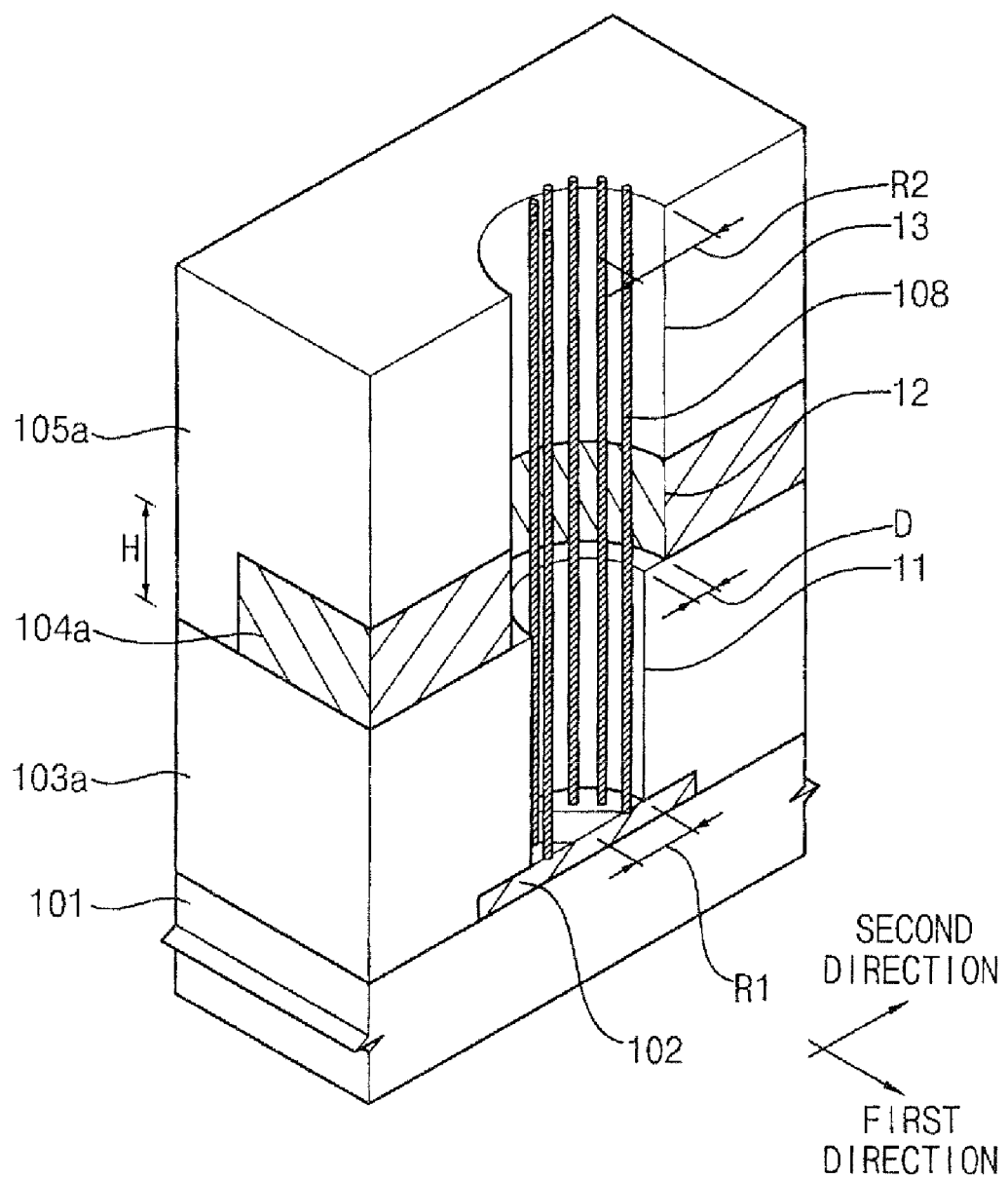

Referring to FIG. 10, at least one carbon nano-tube 108 vertically grows from the portion of the first conductive structure 102 exposed through the first hole 11. Here, a height of the carbon nano-tube 108 may be substantially larger than that of the third insulating layer pattern 105a.

As illustrated above, the spacer 107 is removed before the carbon nano-tube 108 grows. Thus, the carbon nano-tube 108 may be spaced apart from the second conductive structure pattern 104a by the width D of the lower end of the spacer 107.

Figure 11:
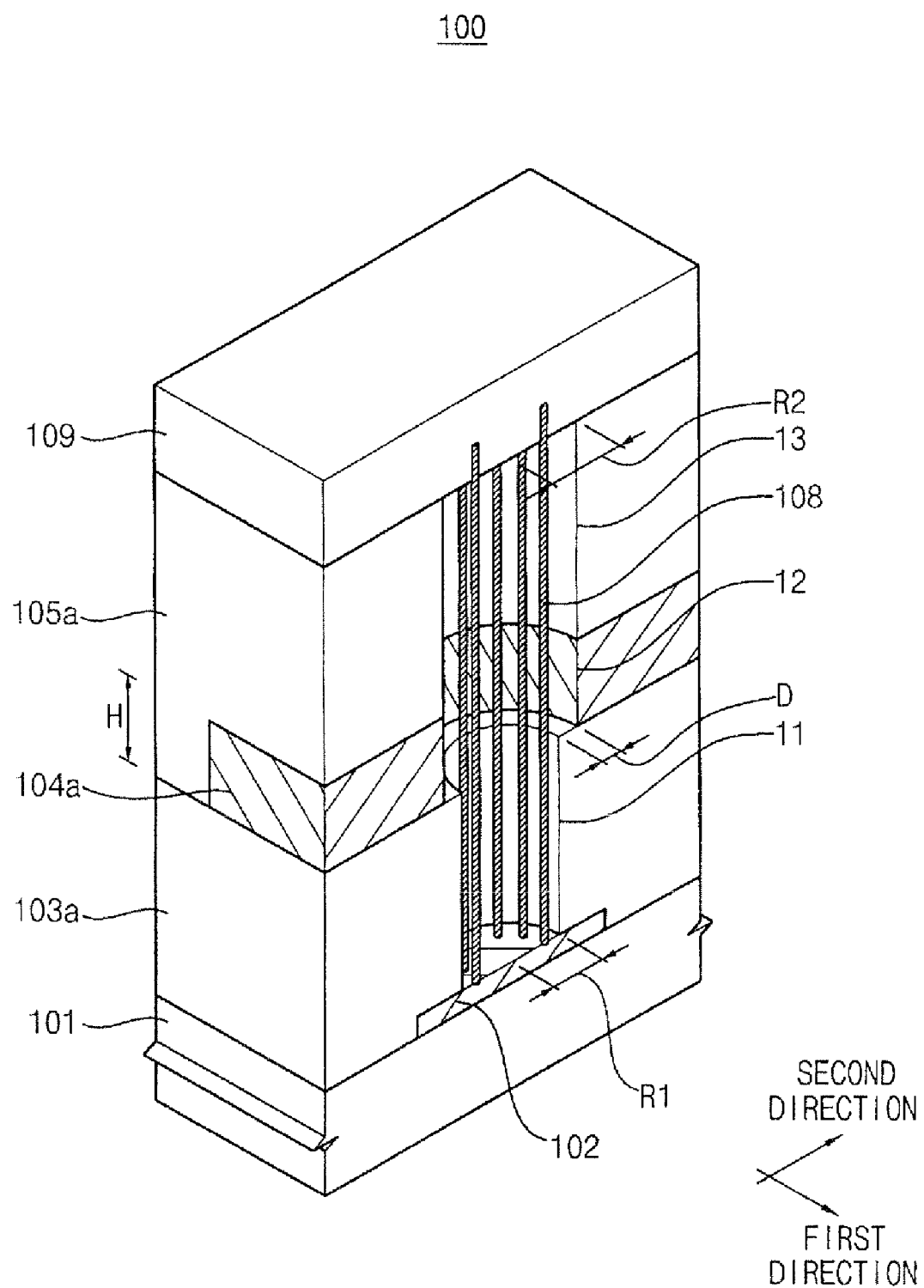

Referring to FIG. 11, a capping layer 109 is formed on the third insulating layer pattern 105a including an insulating material so that the transistor 100 may be manufactured. Here, an upper end of the carbon nano-tube 108 may be fixed to the capping layer 109. The formation of the capping layer 109 is optional. Thus, the capping layer 109 may not be formed.

Hereinafter, an operation of the transistor in FIG. 1 is illustrated.

Figure 12:
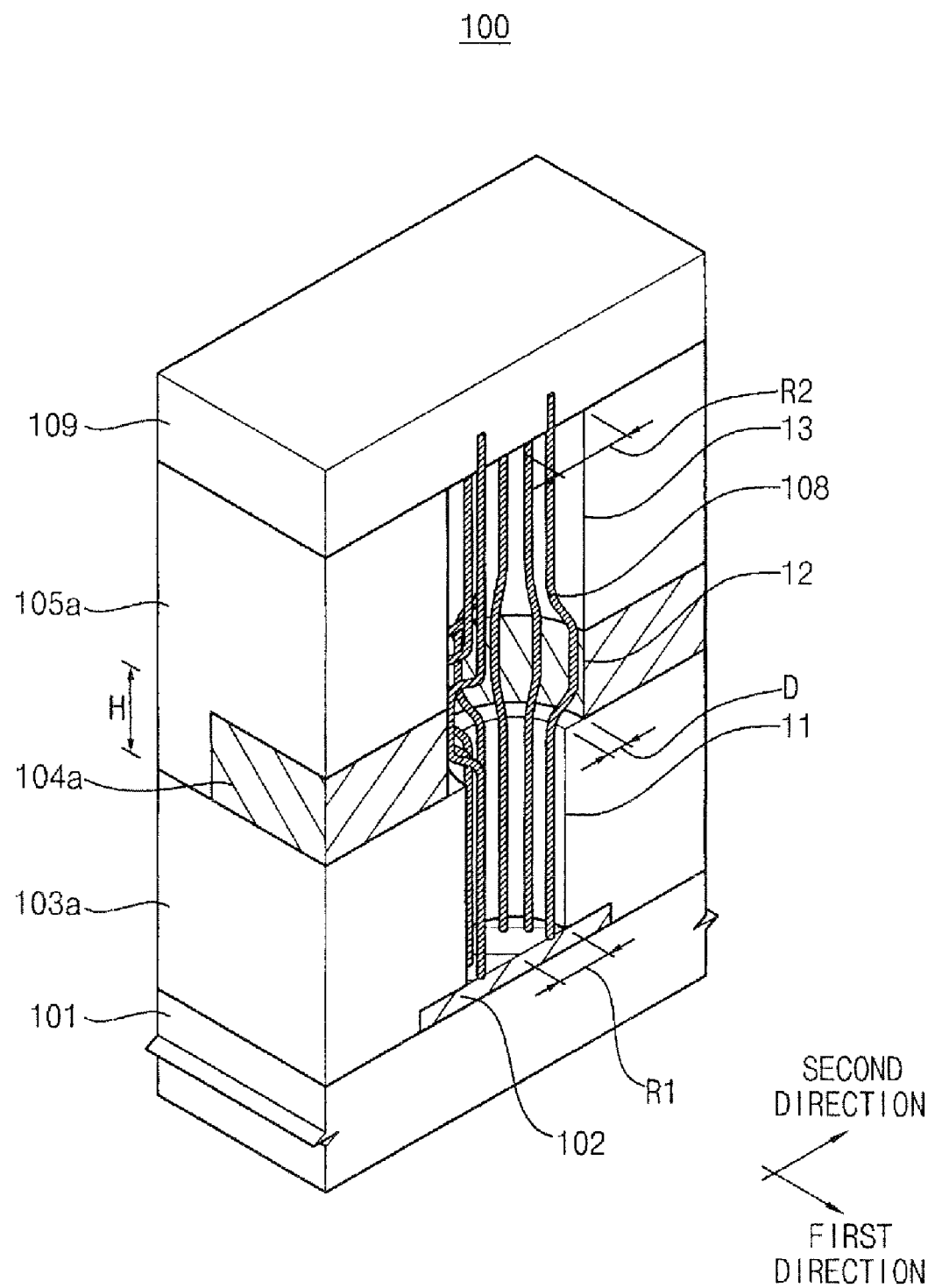
FIGS. 12 to 13 are partially cut perspective views illustrating an operation of the transistor in FIG. 1.
Figure 13:
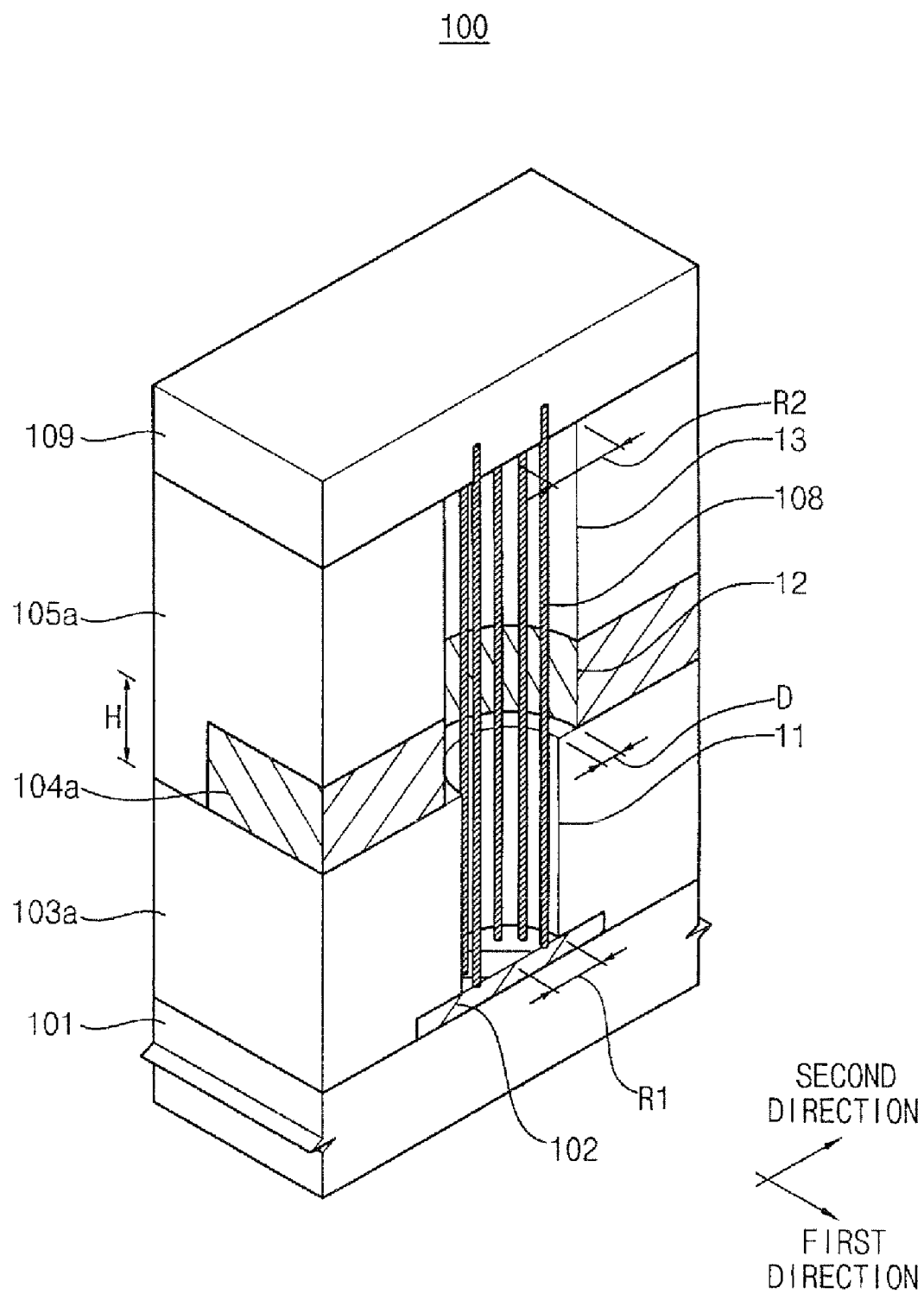

FIGS. 12 to 13 are partially cut perspective views illustrating the operation of the transistor 100 in FIG. 1.

Referring to FIG. 12, different bias voltage polarities may be applied to the first conductive structure 102 and the second conductive structure pattern 104a, respectively. In this case, an electrostatic attraction is generated between the second conductive structure pattern 104a and the carbon nano-tube 108. When the electrostatic attraction is larger than a predetermined energy barrier, the carbon nano-tube 108 may be connected to the second conductive structure pattern 104a. This state may be defined as an "on" state.

Here, the energy barrier may be determined by not only an inherent elasticity of the carbon nano-tube 108 but also a height H of the second conductive structure pattern 104a, a distance D between the carbon nano-tube 108, the second conductive structure pattern 104a, and so on.

Particularly, the distance D between the carbon nano-tube 108 and the second conductive structure pattern 104a is the width D (or slightly greater, because of the distance between the carbon nano-tube 108 and an inner sidewall of the first hole 11) of the lower end of the spacer 107. Thus, the operation voltage of the transistor 100 may be effectively adjusted by controlling a formation of the spacer 107.

Referring to FIG. 13, bias voltages having the same polarity may be applied to the first conductive structure 102 and the second conductive structure pattern 104a, respectively. In this case, an electrostatic repulsion may be generated between the carbon nano-tube 108 and the second conductive structure pattern 104a. When the electrostatic repulsion is larger than the inherent elasticity of the carbon nano-tube 108, the carbon nano-tube 108 may be determinately spaced apart from the second conductive structure pattern 104a. This state may be defined as an "off" state. The transistor 100 may have a switching function by using a difference between the "on" state and the "off" state.

Figure 14:
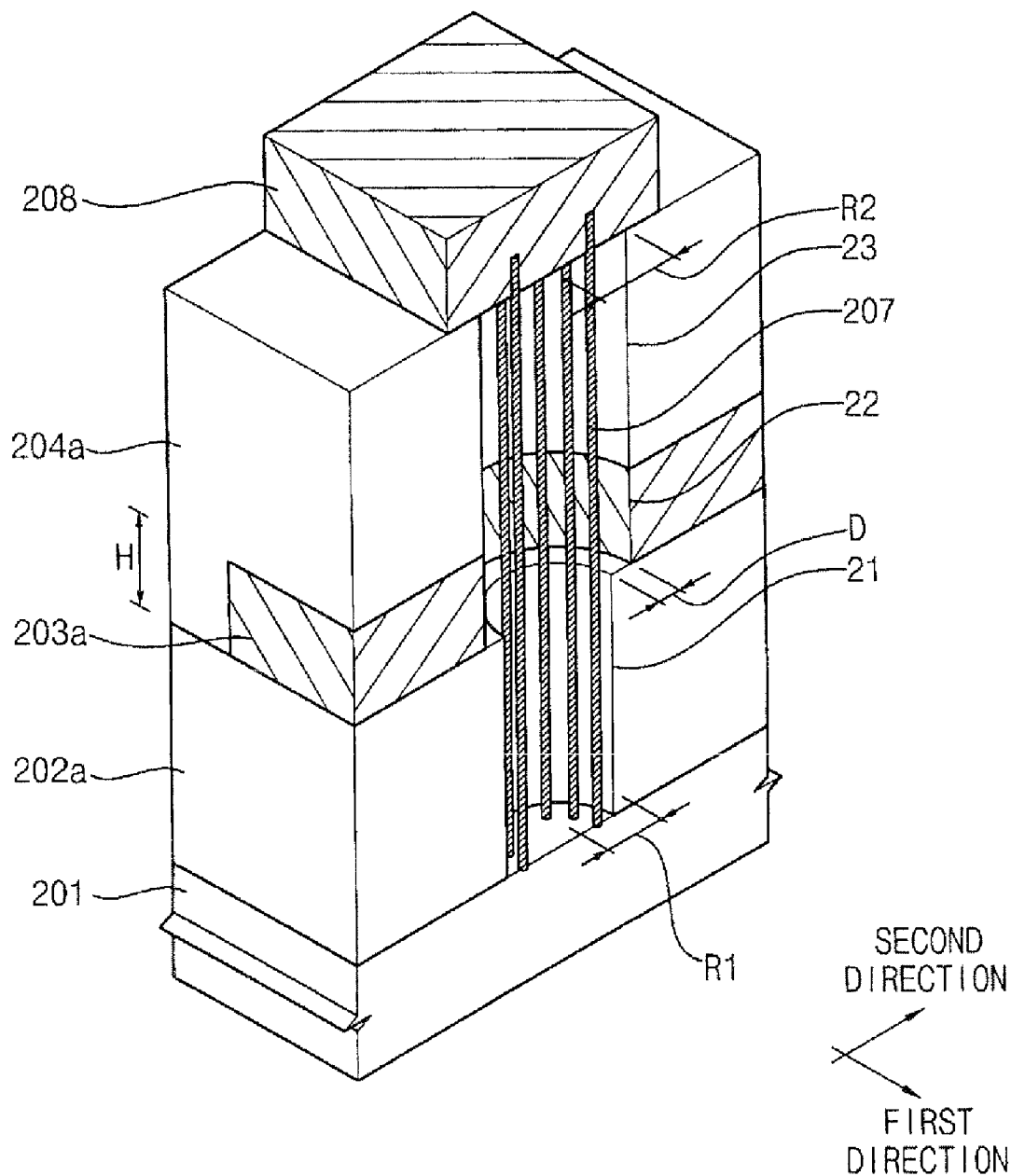
FIG. 14 is a partially cut perspective view illustrating a transistor in accordance with an example embodiment of the present invention.

FIG. 14 is a partially cut perspective view illustrating a transistor in accordance with an example embodiment of the present invention.

Briefly, a principal difference between the last described embodiment and the following embodiment is the "inversion" of the two conductive structures. In the last embodiment, the first conductive structure 102 is below the second conductive structure pattern 104a. In the following embodiment, this scheme is inverted. Details now follow.

Referring to FIG. 14, a transistor 200 may include a first insulating layer 201, a second insulating layer pattern 202a, a first conductive structure pattern 203a, a third insulating layer pattern 204a, at least one carbon nano-tube 207 and a second conductive structure 208.

The first insulating layer 201 may include an insulating material such as silicon nitride. A seed (not shown) may be formed on the first insulating layer 201. The seed is required for growing a carbon nano-tube. The seed may be shaped substantially in a film. Alternatively, the seed may be particles having nano sizes. For example, the seed may include nickel, iron, cobalt, or an alloy of the metals.

The second insulating layer pattern 202a is provided on the first insulating layer 201. The second insulating layer pattern 202a may include an insulating material such as silicon oxide. The second insulating layer pattern 202a may define a first hole 21 exposing the first insulating layer 201. The first hole 21 has a first radius R1.

The first conductive structure pattern 203a is provided on the second insulating layer pattern 202a. The first conductive structure pattern 203a may include a conductive material such as a metal, an alloy or doped polysilicon. The third insulating layer pattern 204a, which may include an insulating material such as silicon oxide, is provided on the second insulating layer pattern 202a and the first conductive structure pattern 203a.

The first conductive structure pattern 203a may have a substantially linear shape extending in a first direction. The first conductive structure pattern 203a may define a second hole 22 communicating with the first hole 23. The second hole 22 may have a second radius R2 larger than the first radius R1 by a predetermined width D.

Particularly, the first conductive structure pattern 203a may fully enclose the second hole 22. In this case, the second hole 22 may be provided through a central portion of the first conductive structure pattern 203a.

Alternatively, the first conductive structure pattern 203a may only partially enclose a lower portion of the second hole 22. For example, the first conductive structure pattern 203a may enclose about half the lower portion of the second hole 22. When the first conductive structure pattern 203a partially encloses the lower portion of the second hole 22, the first conductive structure pattern 203a may have a recessed side portion. In this case, the first conductive structure pattern 203a and the third insulating layer pattern 204a together may define the second hole 22.

When the first conductive structure pattern 203a partially encloses the second hole 22, a magnetic field generated from the first conductive structure pattern 203a may not affect a movement of the carbon nano-tube that is subsequently formed.

The third insulating layer pattern 204a defines a third hole 23 communicating with the second hole 22. The third hole 23 may have the second radius R2.

The carbon nano-tube 207 may vertically grow from a portion of the first insulating layer 201 exposed through the first hole 21. Here, a height of the carbon nano-tube 207 may be substantially larger than that of the third insulating layer pattern 204a. The carbon nano-tube 207 may be spaced apart from the first conductive structure pattern 203a by a predetermined width D.

The second conductive structure 208 is provided on the third insulating layer pattern 204a. The second conductive structure 208 may include a conductive material such as a metal, an alloy or doped polysilicon. The second conductive structure 208 extends in a second direction substantially perpendicular to the first direction. Here, an upper end of the carbon nano-tube 207 is fixed to the second conductive structure 208.

Hereinafter, a method of manufacturing the transistor 200 in FIG. 14 is illustrated in FIGS. 15 to 21, which show partially cut perspective views.

Figure 15:
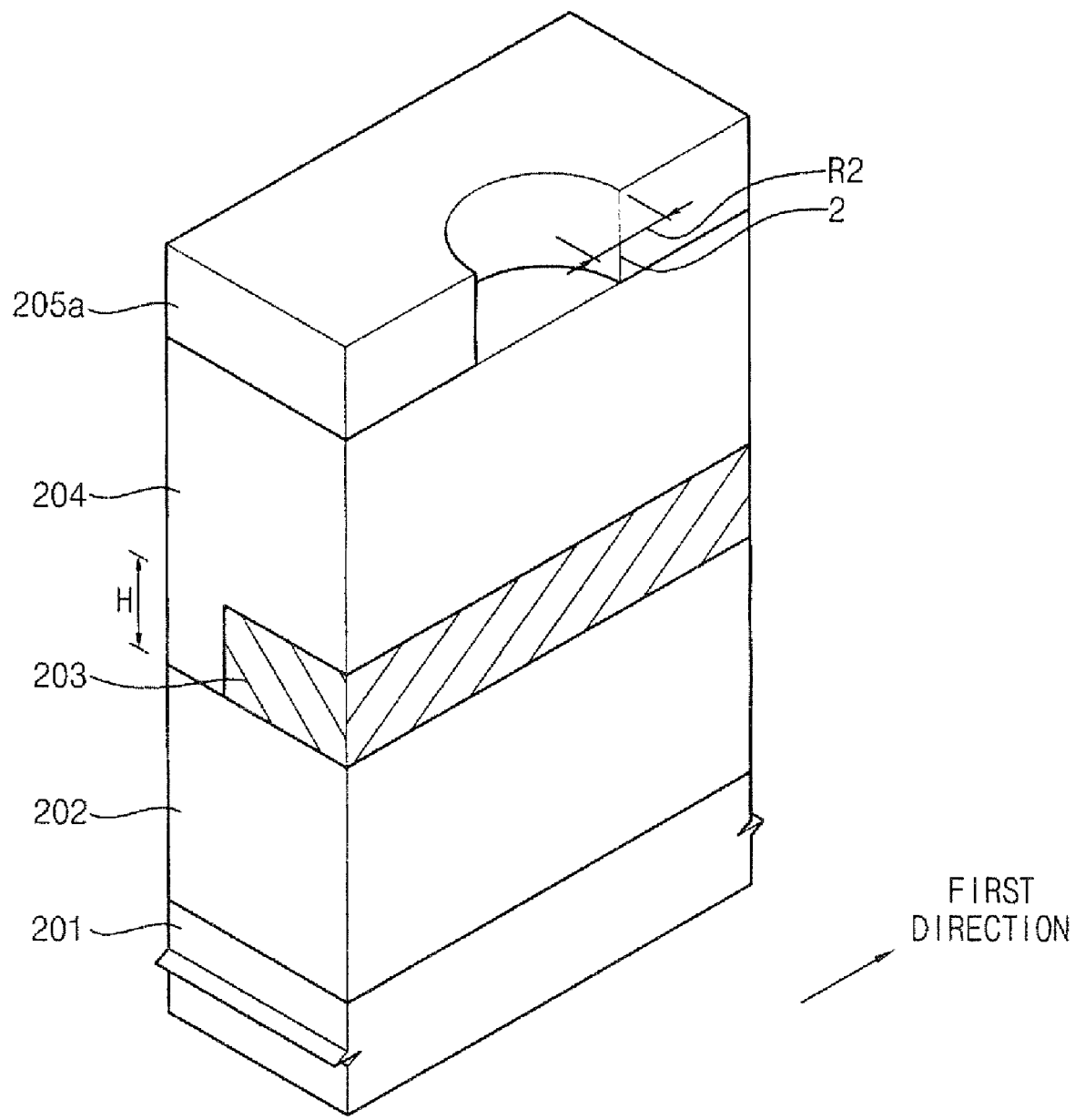
FIGS. 15 to 21 are partially cut perspective views illustrating a method of manufacturing a transistor in accordance with an example embodiment of the present invention.

Referring to FIG. 15, a first insulating layer 201 is formed using an insulating material such as silicon nitride. Here, a seed (not shown) may be formed on the first insulating layer 201. The seed is required for growing a carbon nano-tube. The seed may be substantially film-shaped. Alternatively, the seed may be nano-sized particles.

Thereafter, a second insulating layer 202 is formed on the first insulating layer 201 using an insulating material such as silicon oxide. A first conductive structure 203 is formed on the second insulating layer 202. The first conductive structure 203 extends in a first direction. The first conductive structure 203 may include a conductive material such as a metal, an alloy or doped polysilicon.

A third insulating layer 204 is formed on the second insulating layer 202 and the second conductive structure 203 using an insulating material such as silicon oxide. Thereafter, a mask layer is formed on the third insulating layer 204 using an insulating material. A photolithography process is performed on the mask layer. Thus, the mask layer is transformed into a mask layer pattern 205a having an opening 2. Here, the opening 2 has a second radius R2.

Figure 16:
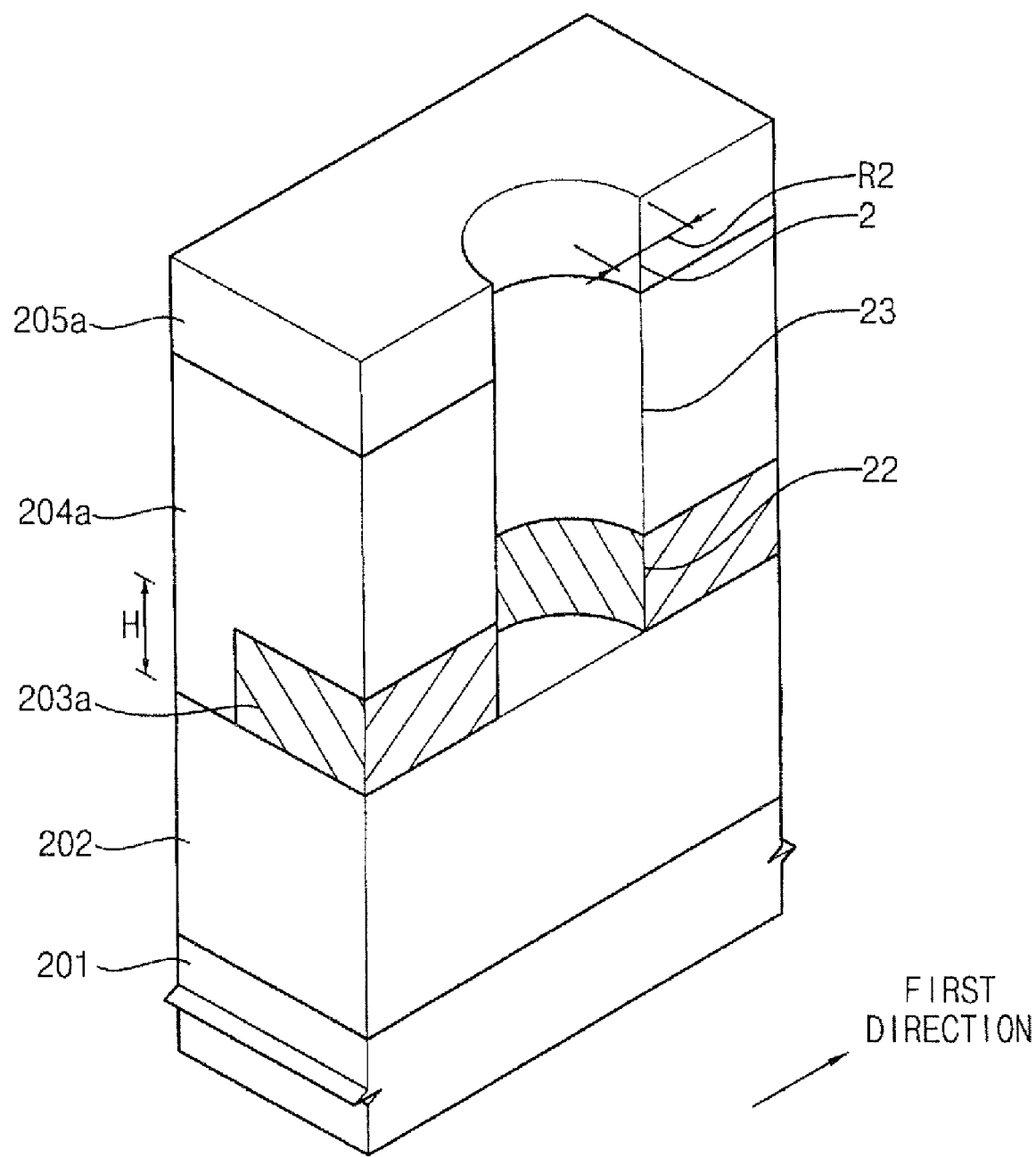

Referring to FIG. 16, the third insulating layer 204 and the first conductive structure 203 are anisotropically etched using the mask layer pattern 205a as an etch mask until the second insulating layer 202 is exposed. Thus, the third insulating layer 204 and the first conductive structure 203 are transformed into a third insulating layer pattern 204a and a first conductive structure pattern 203a. Here, the third insulating layer pattern 204a may define a third hole 23 communicating with the opening 2. The third hole 23 has the second radius R2. The first conductive structure pattern 203a defines a second hole 22 communicating with the third hole 23, The second hole 22 has the second radius R2.

Particularly, the first conductive structure pattern 203a may fully enclose the second hole 22. In this case, the second hole 22 may be formed through a central portion of the first conductive structure pattern 203a.

Alternatively, as mentioned earlier, the first conductive structure pattern 203a may only partially enclose a lower portion of the second hole 22.

Figure 17:
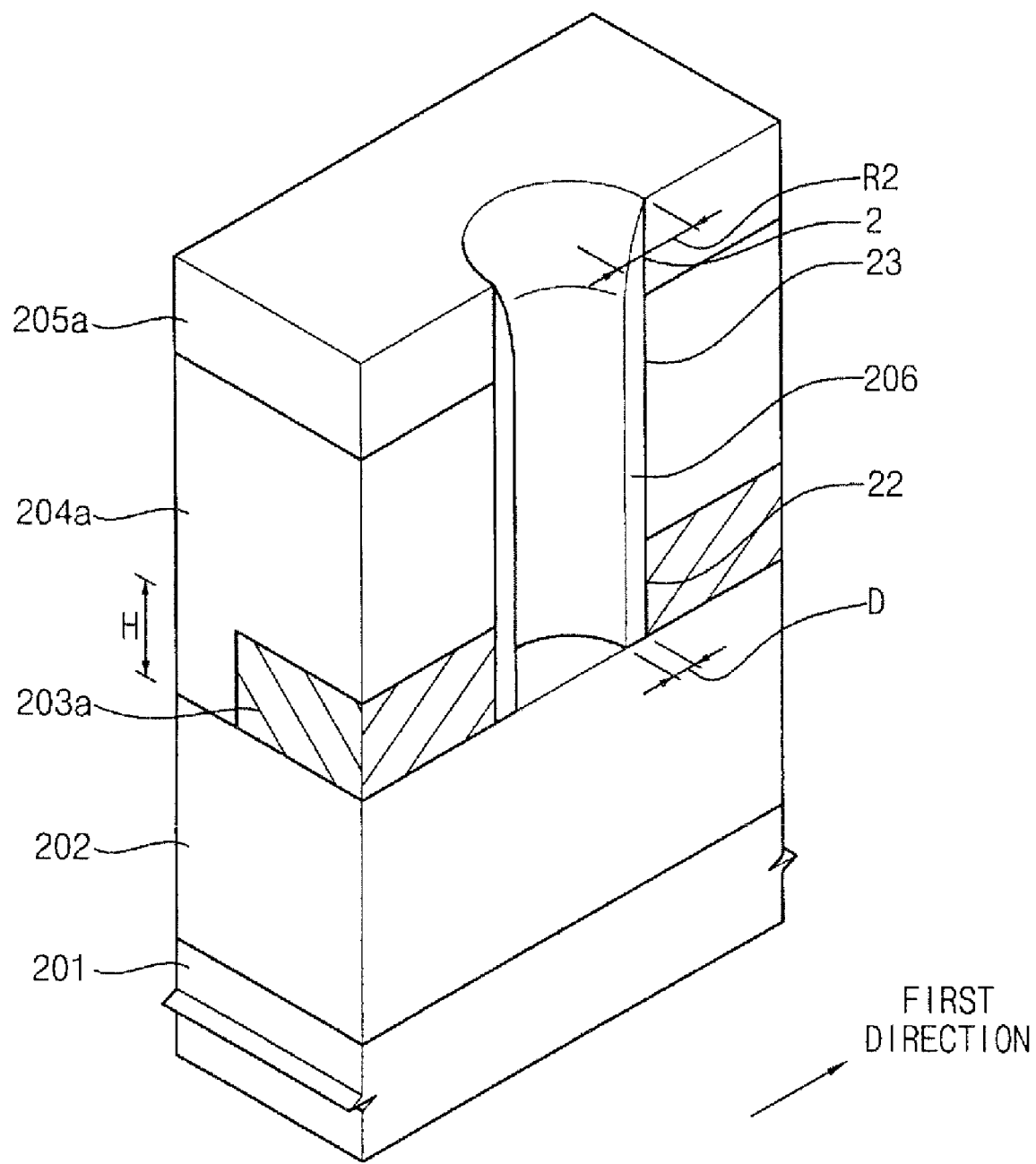

Referring to FIG. 17, an insulating layer (not shown) including an insulating material such as silicon nitride may be formed on the mask layer pattern 205a to fill the third hole 23 and the second hole 22. Thereafter, the insulating layer is anisotropically etched. Thus, the insulating layer may be transformed into a spacer 206 located on inner walls of the third hole 23 and the second hole 22. Here, a lower end of the spacer 206 may have a predetermined width.

Figure 18:
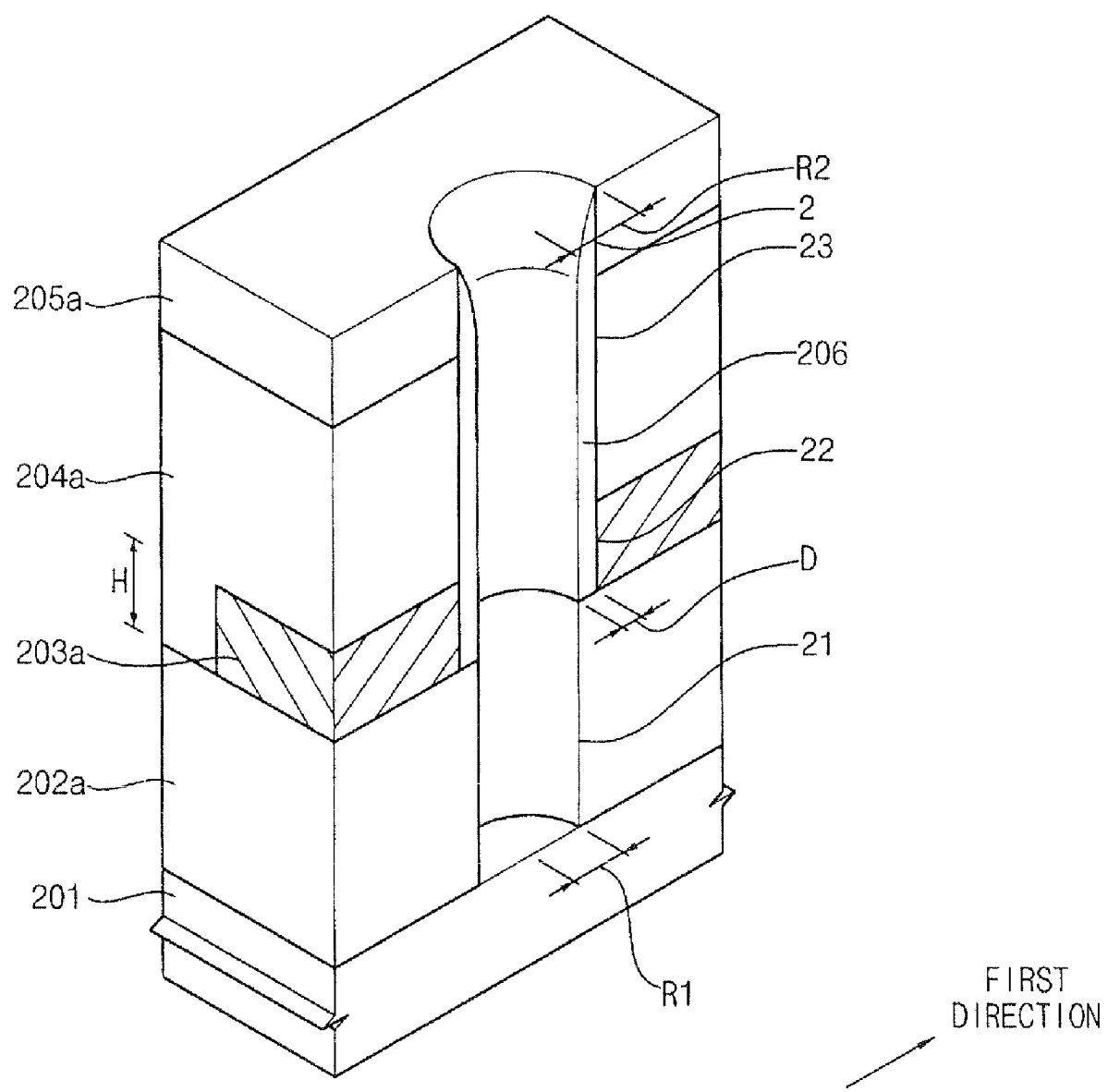

Referring to FIG. 18, the second insulating layer 202 is anisotropically etched using the mask layer pattern 205a and the spacer 206 as an etch mask until the first insulating layer 201 is exposed. Thus, the second insulating layer 202 may be transformed into a second insulating layer pattern 203a having a first hole 21 communicating with the second hole 22. Here, the first hole 21 may have a first radius R1 substantially smaller than the second radius R2. Particularly, the first radius R1 may be smaller than the second radius R2 by a width D of the lower end of the spacer 206.

Here, when the seed for growing the carbon nano-tube is not formed on the first conductive structure 201 before the second insulating layer 202 is formed, the seed may be formed on a portion of the first conductive structure 201 exposed through the first hole 21.

Figure 19:
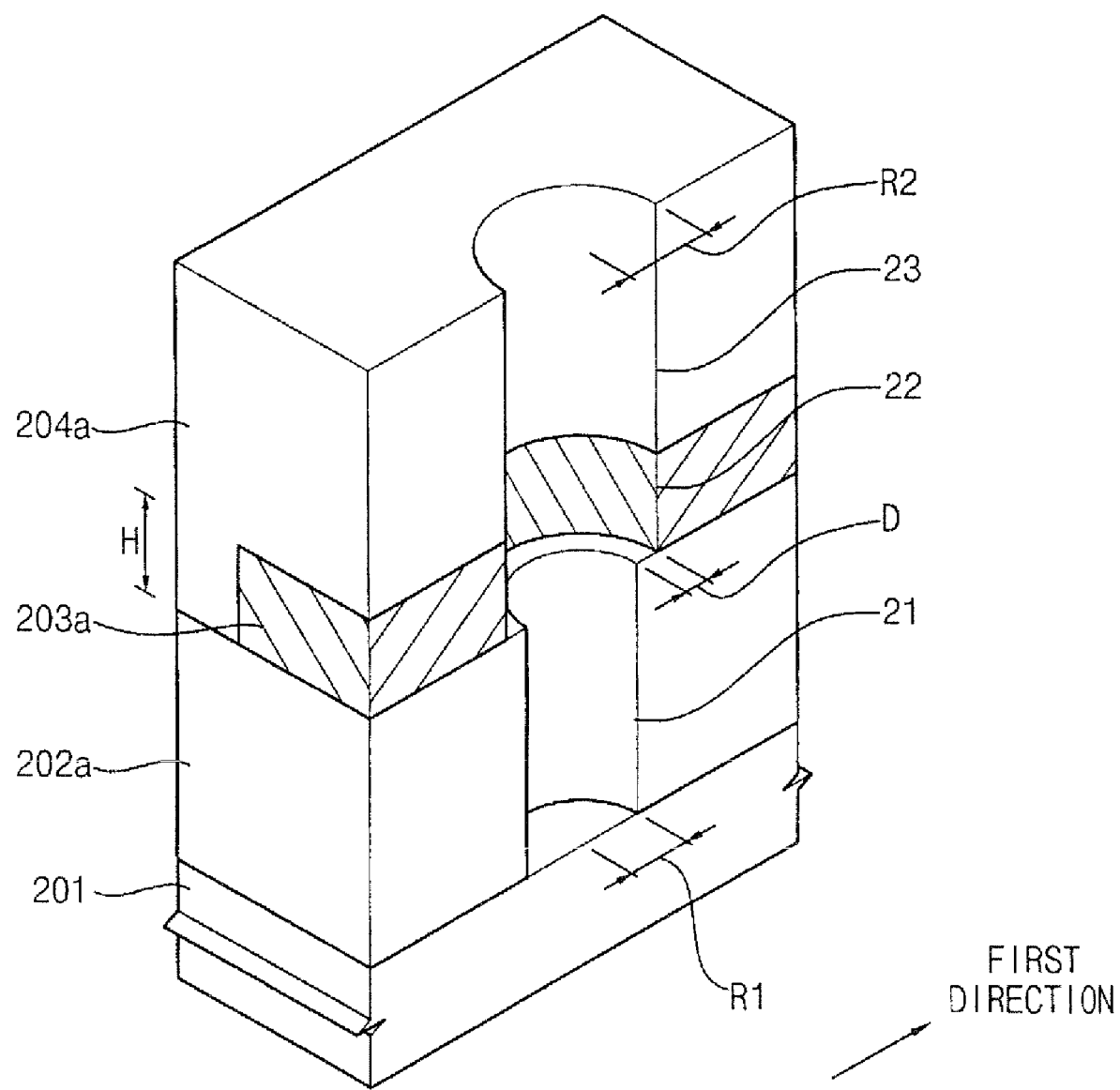

Referring to FIG. 19, the mask layer pattern 205a and the spacer 206 are removed.

Figure 20:
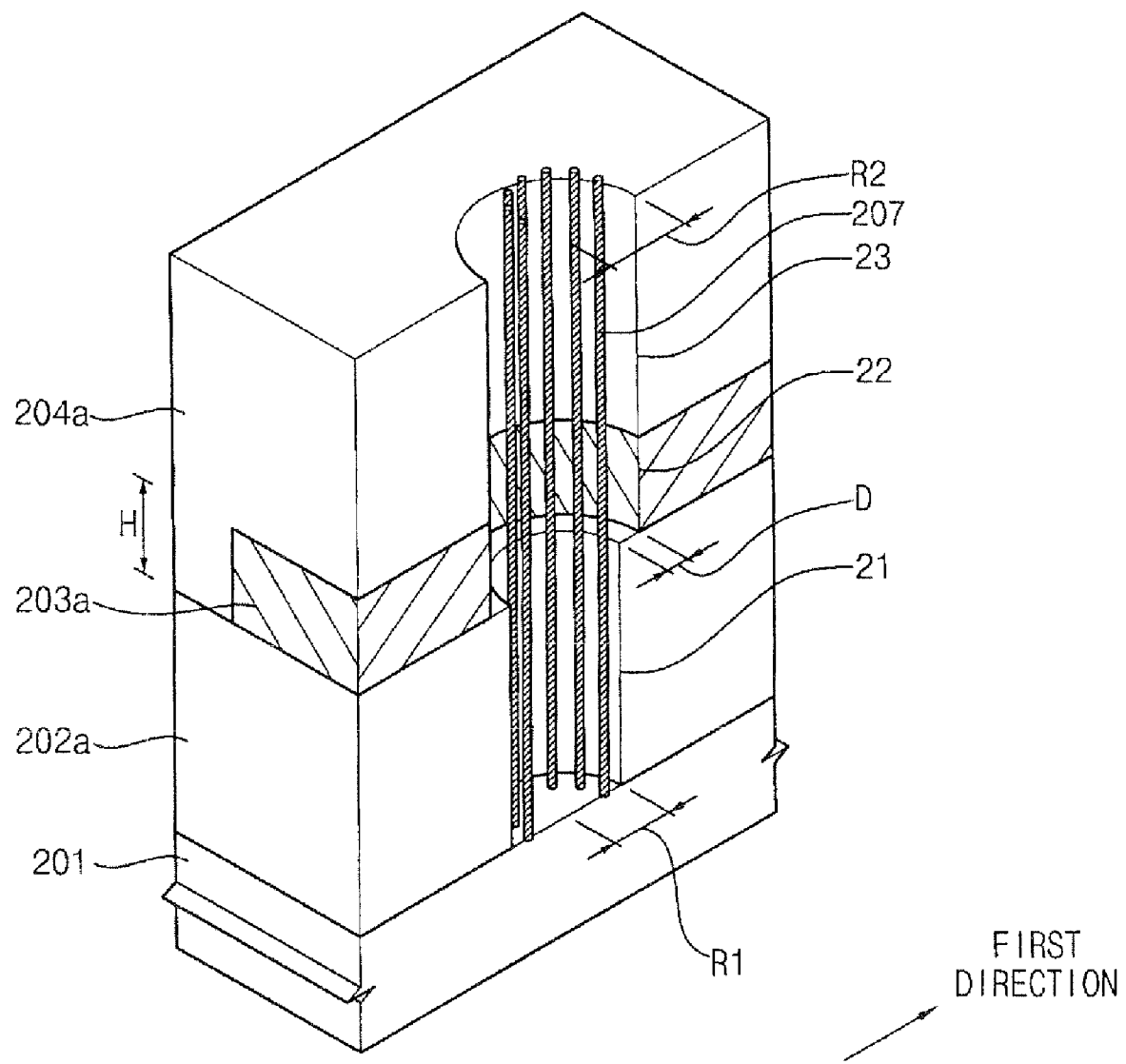

Referring to FIG. 20, at least one carbon nano-tube 207 vertically grows from the portion of the first conductive structure 201 exposed through the third hole 23. Here, a height of the carbon nano-tube 207 may be substantially larger than that of the third insulating layer pattern 204a.

As illustrated above, the spacer 206 is removed before the carbon nano-tube 207 grows. Thus, the carbon nano-tube 207 may be spaced apart from the first conductive structure pattern 203a by the width D of the lower end of the spacer 207.

Figure 21:
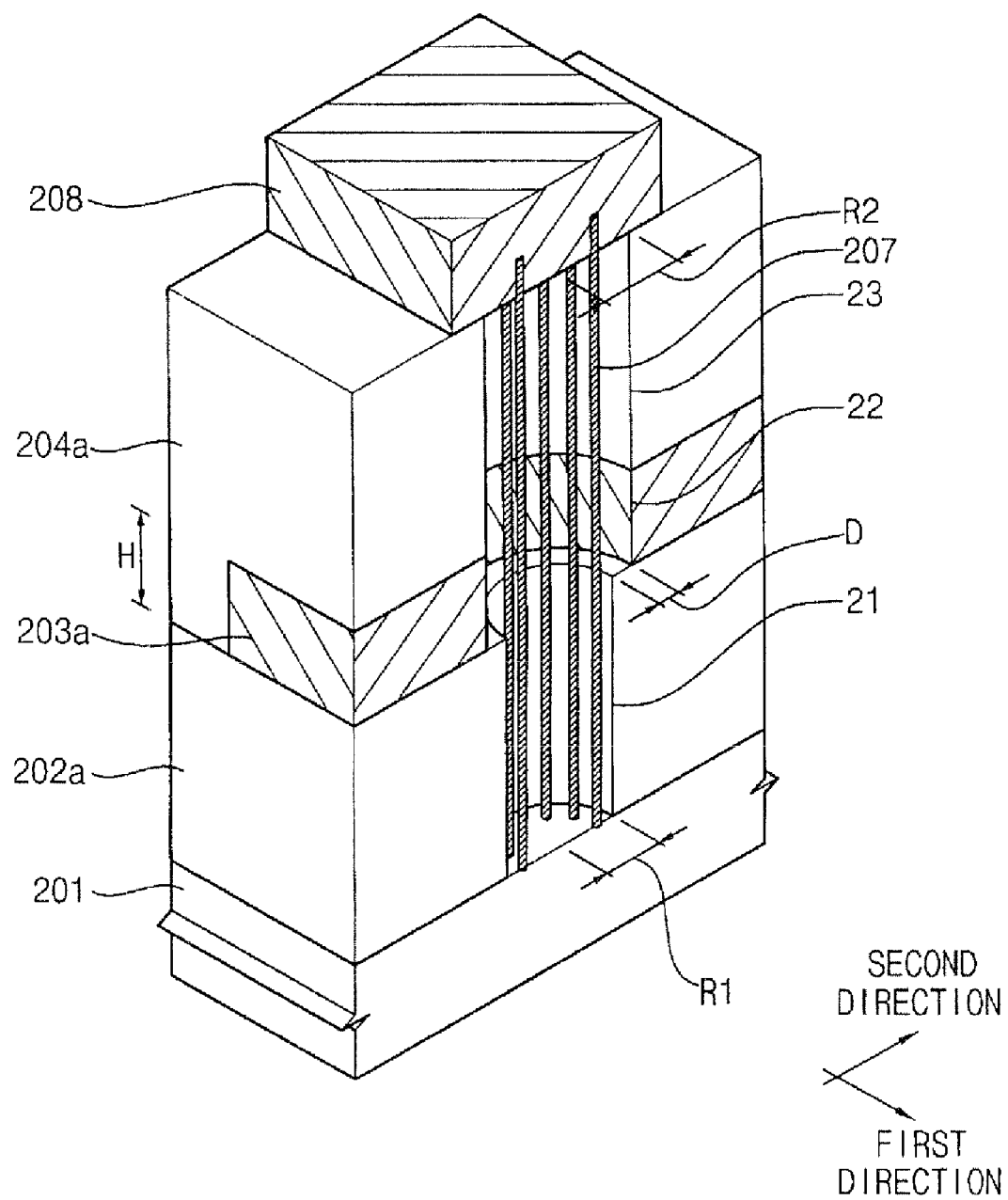

Referring to FIG. 21, a second conductive structure 208 extending in a second direction substantially perpendicular to the first direction is formed on the third insulating layer pattern 204a. The second conductive structure 208 may include a conductive material such as a metal, an alloy or doped polysilicon, thereby manufacturing the transistor, for example. Here, an upper end of the carbon nano-tube 207 may be fixed to the second conductive structure 208.

Hereinafter, an operation of the transistor 200 in FIG. 14 is illustrated using FIGS. 22 to 23, which are partially cut perspective views.

Figure 22:
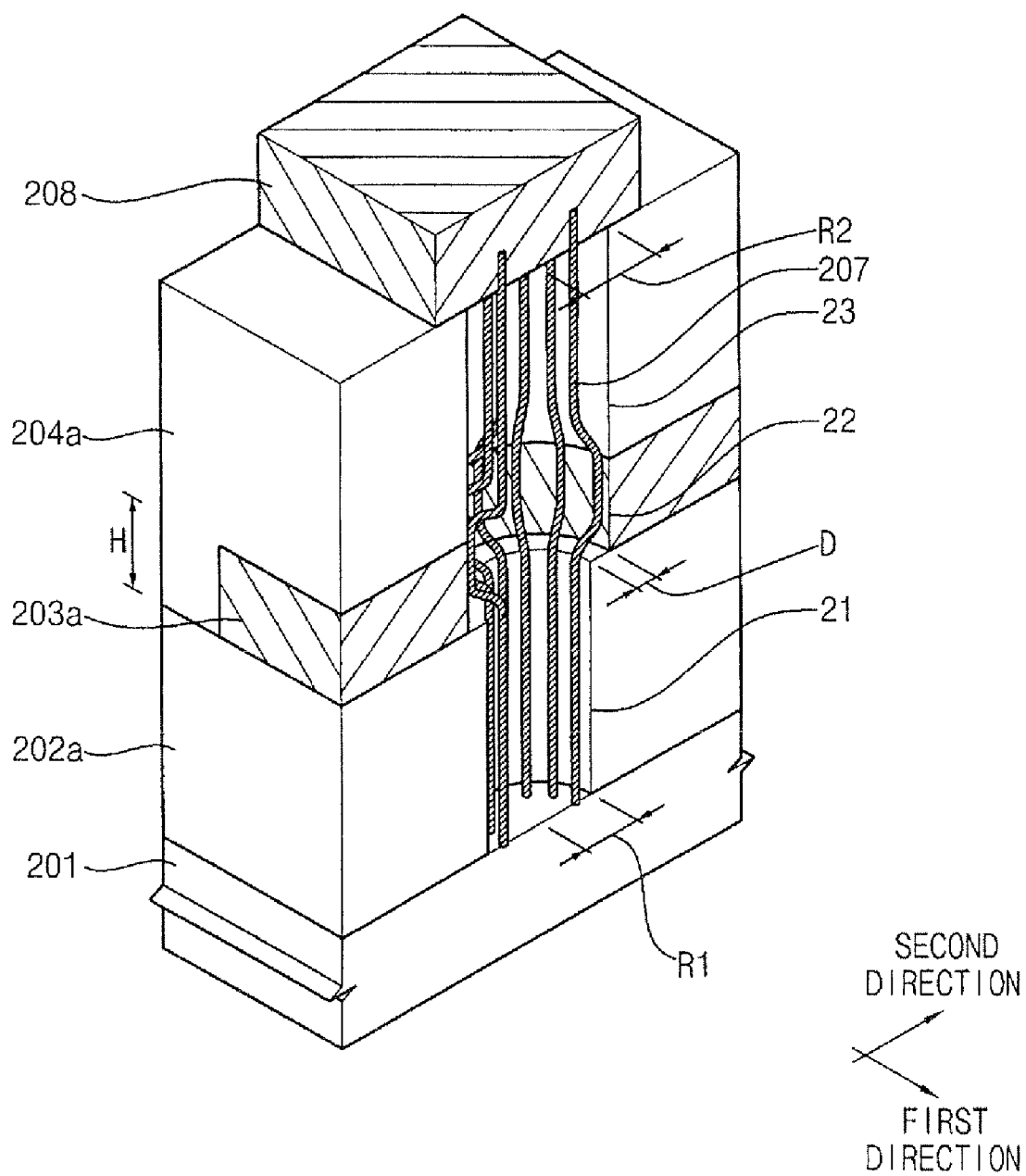
FIGS. 22 to 23 are perspective views illustrating an operation of the transistor in FIG. 14.

Referring to FIG. 22, different bias voltages may be applied to the first conductive structure 203a and the second conductive structure pattern 208, respectively. In this case, an electrostatic attraction is generated between the first conductive structure pattern 203a and the carbon nano-tube 207. When the electrostatic attraction is larger than a predetermined energy barrier, the carbon nano-tube 207 may be attached to the first conductive structure pattern 203a. This state may be defined as an "on" state.

Here, the energy barrier may be determined by not only an inherent elasticity of the carbon nano-tube 207 but also a height H of the first conductive structure pattern 203a, a distance D between the carbon nano-tube 207, the first conductive structure pattern 203a, and so on.

Particularly, the distance D between the carbon nano-tube 207 and the first conductive structure pattern 203a is the width D of the lower end of the spacer 206. Thus, the operation voltage of the transistor 200 may be effectively adjusted by controlling a formation of the spacer 206.

Figure 23:
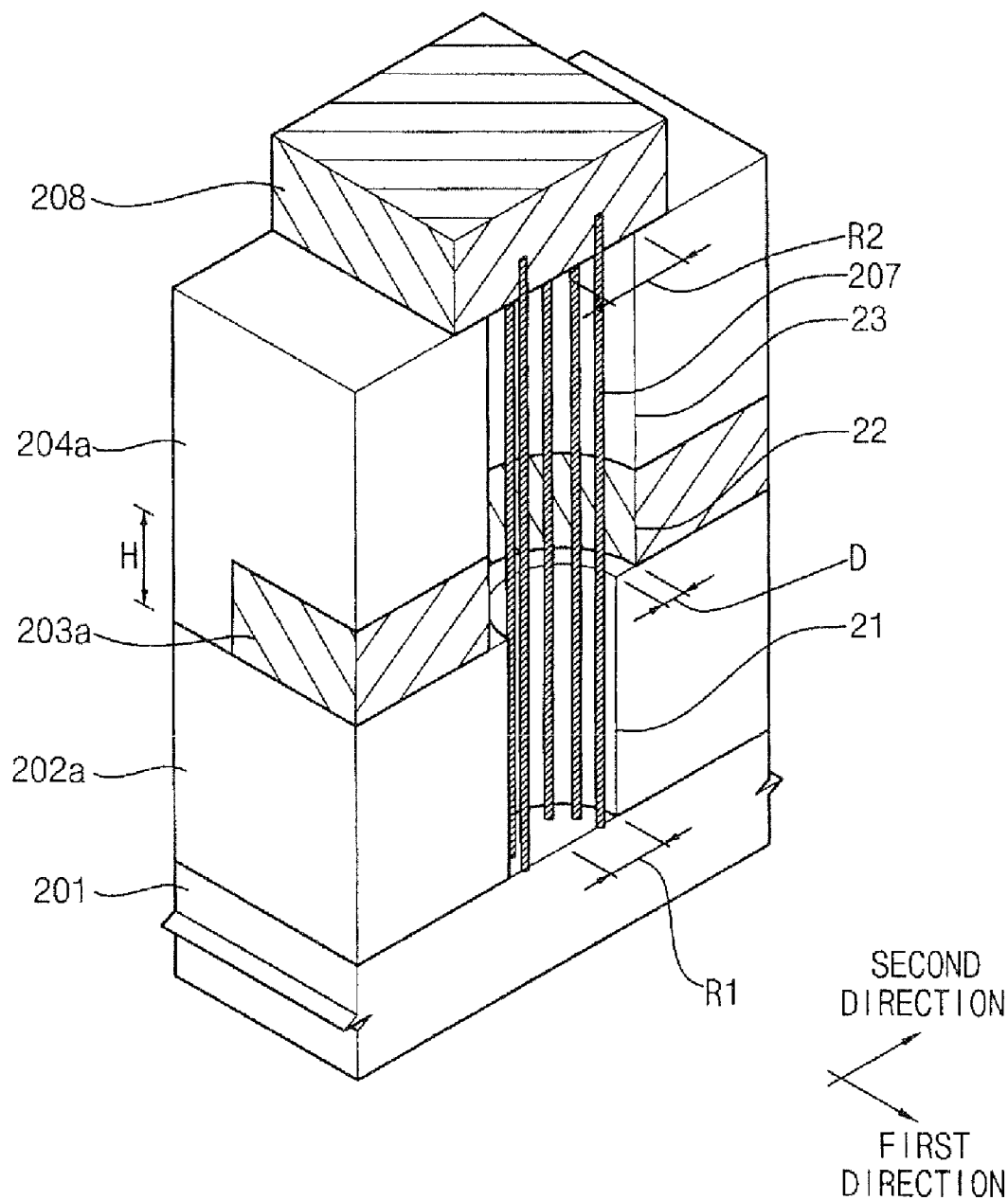

Referring to FIG. 23, bias voltages having the same polarity may be applied to the second conductive structure 208 and the first conductive structure pattern 203a, respectively. In this case, an electrostatic repulsion may be generated between the first conductive structure 203a and the carbon nano-tube 207. When the electrostatic repulsion is larger than the inherent elasticity of the carbon nano-tube 207, the carbon nano-tube 207 may be spaced apart from the first conductive structure pattern 203a. This state may be defined as an "off" state.

The transistor 200 may have a switching function by using a difference between the "on" state and the "off" state.

Hereinafter, a method of manufacturing a transistor in accordance with an example embodiment of the present invention are illustrated with reference to FIGS. 24 to 36, which show partially cut perspective views. In the present embodiment, the method of manufacturing the transistor includes forming a multilayer insulating layer between a first conductive structure and a second conductive structure, and forming a sacrificial layer.

Figure 24:
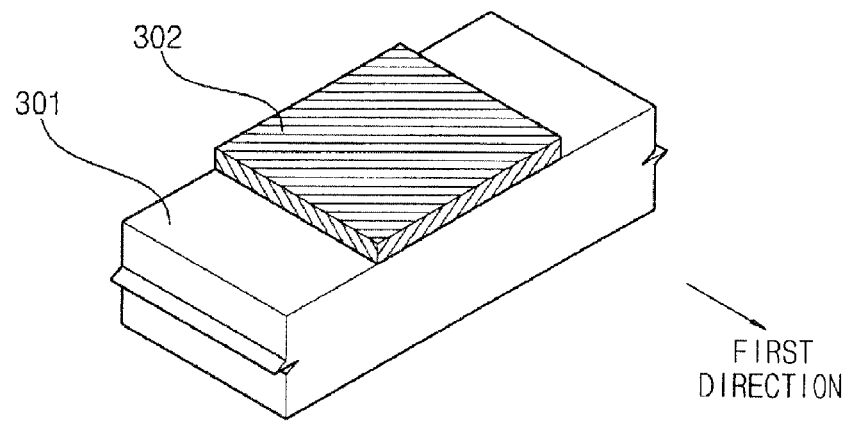
FIGS. 24 to 36 are partially cut perspective views illustrating a method of manufacturing a transistor in accordance with an example embodiment of the present invention.

Referring to FIG. 24, a first conductive structure 302 is formed on a bottom insulating layer 301. The bottom insulating layer 301 may include an insulating material such as silicon nitride, silicon oxide, etc. The first conductive structure 302 may be formed using a conductive material such as a metal, an alloy or doped polysilicon. In an example embodiment of the present invention, the first conductive structure is formed using titanium nitride. The first conductive structure 302 may be formed to have a substantially linear shape extending in a first direction.

A seed layer (not shown) may be formed on the first conductive structure 302. The seed layer may be used for growing a carbon nano-tube 315 (see FIG. 35) in a successive process. In an example embodiment of the present invention, a thin film may be formed on the first conductive structure 302 to serve as the seed layer. Alternatively, nano-sized particles may be formed on the first conductive structure 302 to serve as the seed layer. For example, the seed layer may be formed using nickel, iron, cobalt, or an alloy of these elements. Alternatively, after forming a fourth hole 31 (see FIG. 34) through a first etch-stop layer 303 (see FIG. 25), the seed layer may be formed on a portion of the first conductive structure 302 exposed through the fourth hole 31.

Figure 25:
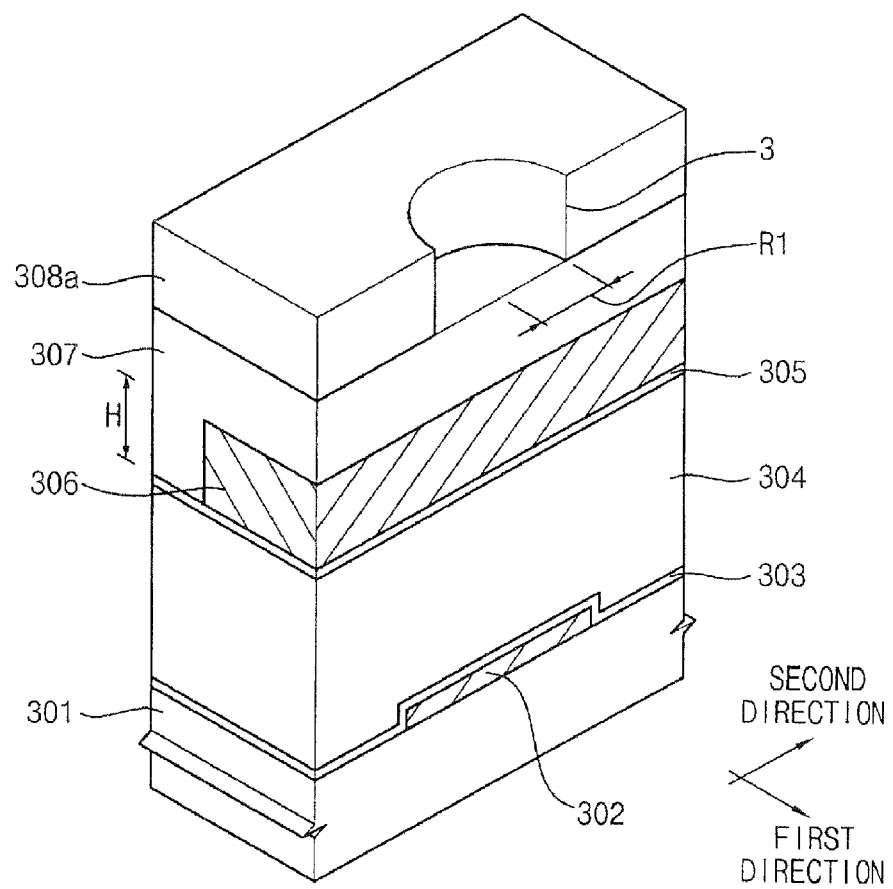

Referring to FIG. 25, a multilayer insulating layer, which includes the first etch-stop layer 303, a first insulating layer 304 and a second etch-stop layer 305 sequentially stacked on the first conductive structure 302 and the bottom insulating layer 301, is formed.

The first etch-stop layer 303 may be formed using a material having an etching selectivity with respect to the first insulating layer 304. Additionally, the first etch-stop layer 303 may be formed using a material having an etching selectivity with respect to the first conductive structure 302. For example, the first etch-stop layer 303 may be formed using silicon nitride, and the first insulating layer 304 may be formed using silicon oxide. In an example embodiment of the present invention, the first etch-stop layer 303 is formed to have a thickness smaller than that of the first insulating layer 304.

The second etch-stop layer 305 may be formed using a material having an etching selectivity with respect to a second conductive structure 306 that will be successively formed on the second etch-stop layer 305. For example, the second etch-stop layer 305 may be formed using silicon nitride or aluminum oxide ($Al_2O_3$).

In an example embodiment of the present invention, the first and second etch-stop layers 303 and 305 are formed using substantially the same material. Alternatively, the first and second etch-stop layers 303 and 305 are formed using a material different from each other. The first etch-stop layer 303 may be formed to have a thickness smaller than that of the first insulating layer 304.

The second conductive structure 306 is formed on the multilayer insulating layer, that is, on the second etch-stop layer 305. The second conductive structure 306 may be formed using a conductive material such as a metal, an alloy or doped polysilicon. The second conductive structure 306 may be formed using a material substantially the same as that of the first conductive structure 302. Alternatively, the second conductive structure 306 may be formed using a material different from that of the first conductive structure 302. In an example embodiment of the present invention, the second conductive structure is formed using titanium nitride. The second conductive structure 306 may be formed to have a substantially linear shape extending in a second direction substantially perpendicular to the first direction. The second conductive structure 306 may be formed to have a predetermined height H.

A second insulating layer 307 is formed on the second conductive structure 306 and the multilayer insulating layer. The second insulating layer 307 may be formed using an insulating material such as silicon oxide, silicon nitride, etc.

A photoresist film is formed on the second insulating layer 307. The photoresist film may be patterned by a photo process to form a photoresist pattern 308a having an opening 3 therethrough. The opening 3 may have a first radius R1, and partially expose the second insulating layer 307. Alternatively, an anti-reflection coating (ARC) layer (not shown) may be further formed on the second insulating layer 307 before forming the photoresist film on the second insulating layer 307, so that reflections of light may be prevented when the photo process is performed.

Figure 26:
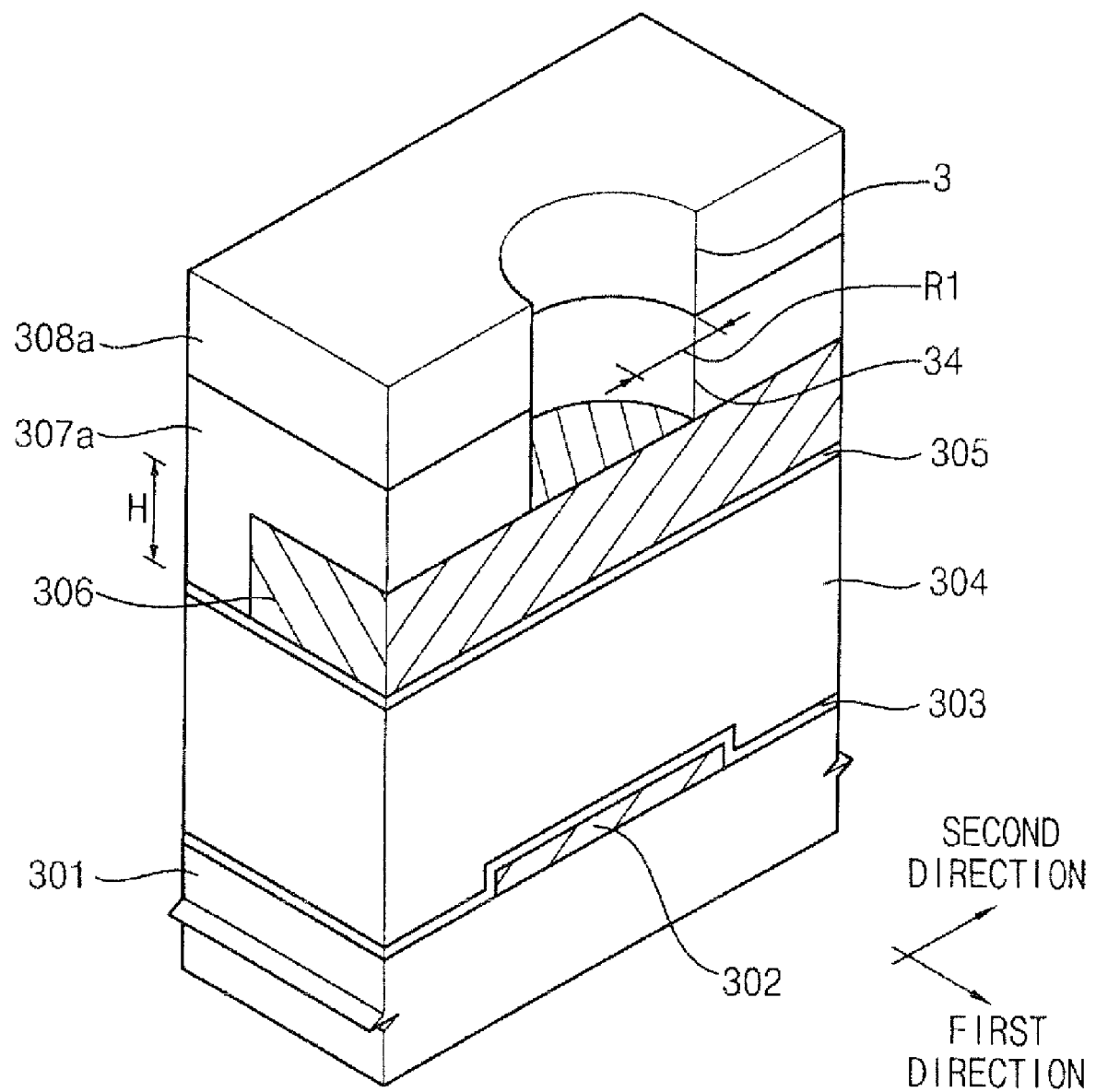

Referring to FIG. 26, the second insulating layer 307 is partially removed until the second conductive structure 306 is exposed, thereby forming a second insulating layer pattern 307a having a first hole 34 therethrough. The first hole 34 may have the first radius R1, and partially expose the second conductive structure 306. The second insulating layer pattern 307a may be formed by an anisotropic etching process using the photoresist pattern 308a as an etch mask. The photoresist pattern 308a may be removed by an ashing process and/or a stripping process.

Figure 27:
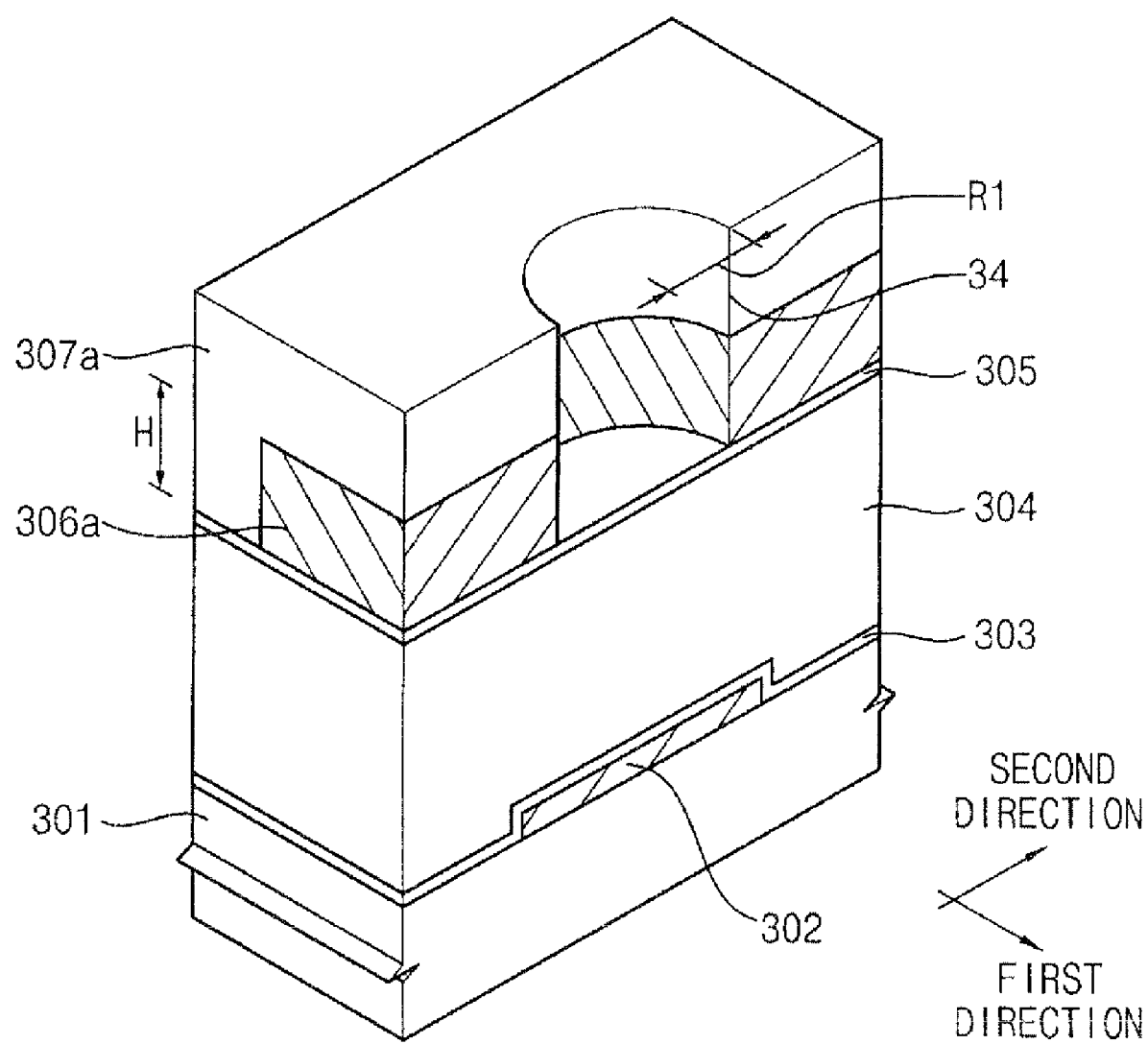

Referring to FIG. 27, the second conductive structure 306 is partially removed until the second etch-stop layer 305 is exposed, thereby forming a second conductive structure pattern 306a having a second hole 33 therethrough. The second hole 33 may have the first radius R1, and partially expose the second etch-stop layer 305. The second conductive structure pattern 306a may be formed by an anisotropic etching process using the photoresist pattern 308a and the second insulating layer pattern 307a as an etch mask. As mentioned above, the second etch-stop layer 305 includes a material having an etching selectivity with respect to the second conductive structure 306, so that the etching process may be stopped when the second etch-stop layer 305 is exposed. Thus, the second etch-stop layer 305 may have a small thickness.

Figure 28:
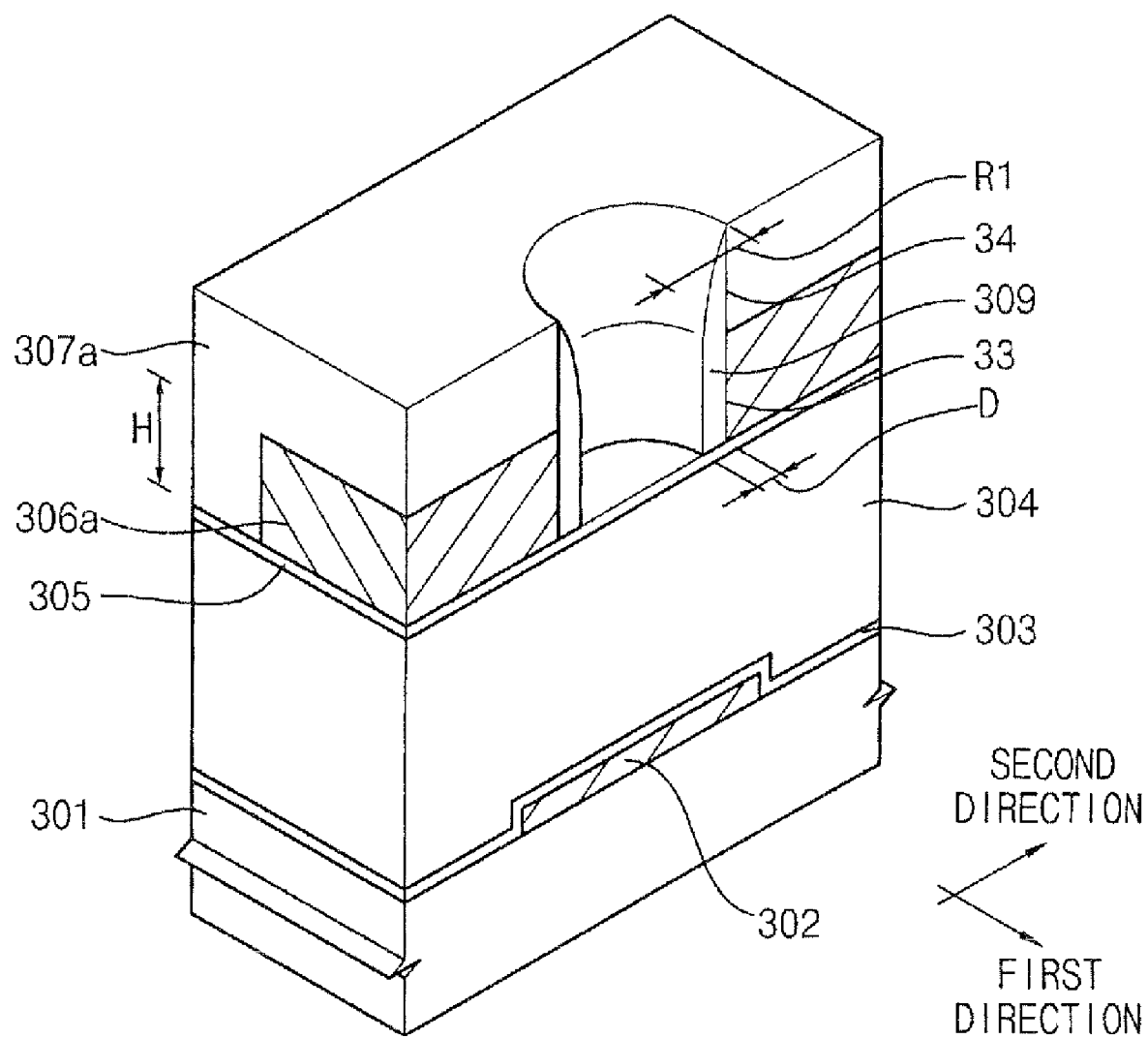

Referring to FIG. 28, a spacer layer is formed on the second etch-stop layer 305 and the second insulating layer pattern 307a to fill up the first and second holes 34 and 33. The spacer layer may be formed using an insulating material such as silicon oxide, silicon nitride, etc. The spacer layer is advantageously formed using silicon oxide having good conforming characteristics. In an example embodiment of the present invention, the spacer layer is formed using a material substantially the same as that of the second insulating layer pattern 307a. Alternatively, the spacer layer is formed using a material different from that of the second insulating layer pattern 307a. The spacer layer may be partially removed by an anisotropic etching process to form a spacer 309 on sidewalls of the first and second holes 34 and 33. The spacer 309 may partially cover the second etch-stop layer 305. A lower end of the spacer 309 may have a predetermined width D.

Figure 29:
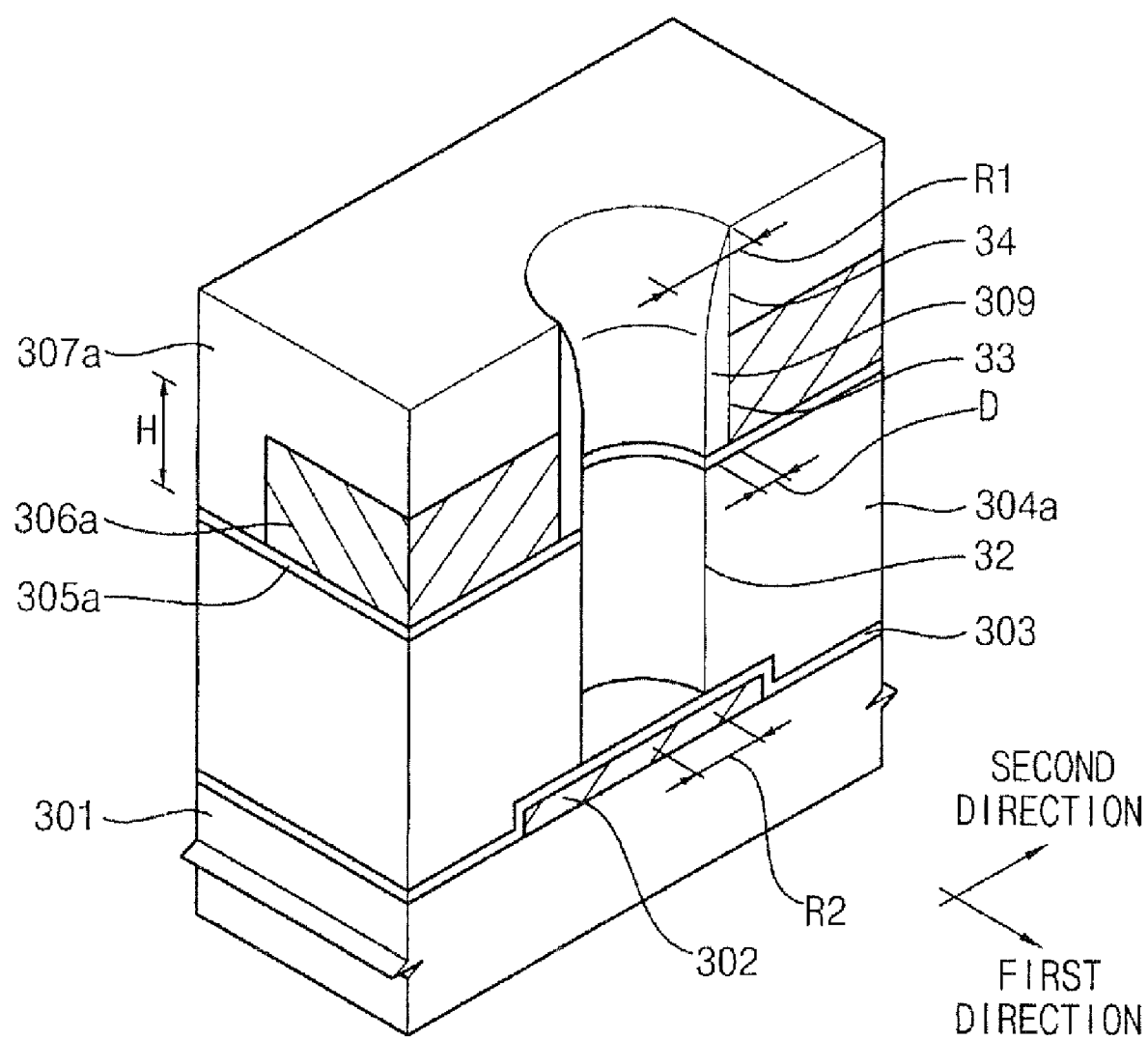

Referring to FIG. 29, the second etch-stop layer 305 and the first insulating layer 304 are partially removed to form a second etch-stop layer pattern 305a and a first insulating layer pattern 304a, respectively.

Particularly, the second etch-stop layer 305 is partially removed until the first insulating layer 304 is exposed, thereby forming the second etch-stop layer pattern 305a. The second etch-stop layer pattern 305a may be formed by an anisotropic etching process using the spacer 309, the second insulating layer pattern 307a and the second conductive structure pattern 306a as an etch mask. When the second etch-stop layer 305 is formed using silicon nitride, the etching process may be performed using carbon tetrafluoride ($CF_4$), trifluoromethane ($CHF_3$), difluoromethane ($CH_2F_2$), etc., as an etching gas. As mentioned above, the second etch-stop layer 305 has a relatively small thickness so that the second etch-stop layer 305 may be removed at a low power in the anisotropic etching process.

The first insulating layer 304 is partially removed until the first etch-stop layer 303 is exposed, thereby forming the first insulating layer pattern 304a. The first insulating layer pattern 304a may be formed by an anisotropic etching process using the spacer 309, the second insulating layer pattern 307a, the second conductive structure pattern 306a and the first etch-stop layer pattern 305a as an etch mask. When the first insulating layer 304 is formed using silicon oxide, the etching process may be performed using $C_2F_6$, $C_3F_8$, $C_4F_6$, $C_4F_8$, $C_5F_8$, $C_6F_6$, etc., as an etching gas. As mentioned above, the first etch-stop layer 303 includes a material having an etching selectivity with respect to the first insulating layer 304, so that the etching process may be stopped when the first etch-stop layer 303 is exposed. Thus, the first etch-stop layer 303 may have a small thickness.

The second etch-stop layer pattern 305a together with the first insulating layer pattern 304a have a third hole 32 therethrough. The third hole 32 may have a second radius R2 smaller than that of the first radius R1, and partially expose the first etch-stop layer 303. Particularly, the second radius R2 may be smaller than the first radius R1 by the width D of the lower end of the spacer 309.

Figure 30:
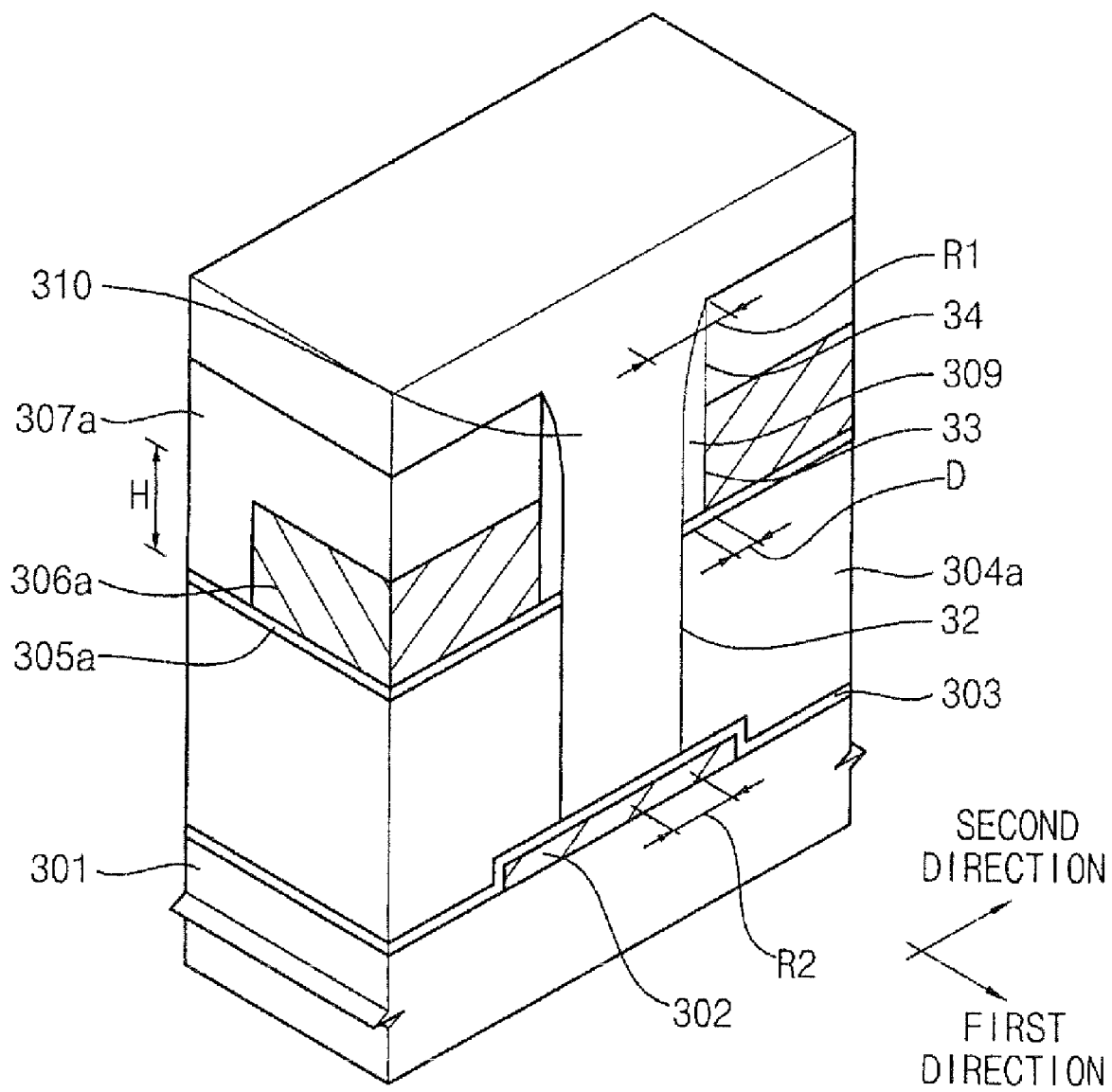

Referring to FIG. 30, a sacrificial layer 310 is formed on the first etch-stop layer 303, the spacer 309 and the second insulating layer pattern 307a to fill up the third hole 32 and remaining portions of the first and second holes 34 and 33. The sacrificial layer 310 may be formed using a carbon-containing silicon oxide, which may have good gap-filling characteristics and easily removed by an ashing process and/or a stripping process.

Figure 31:
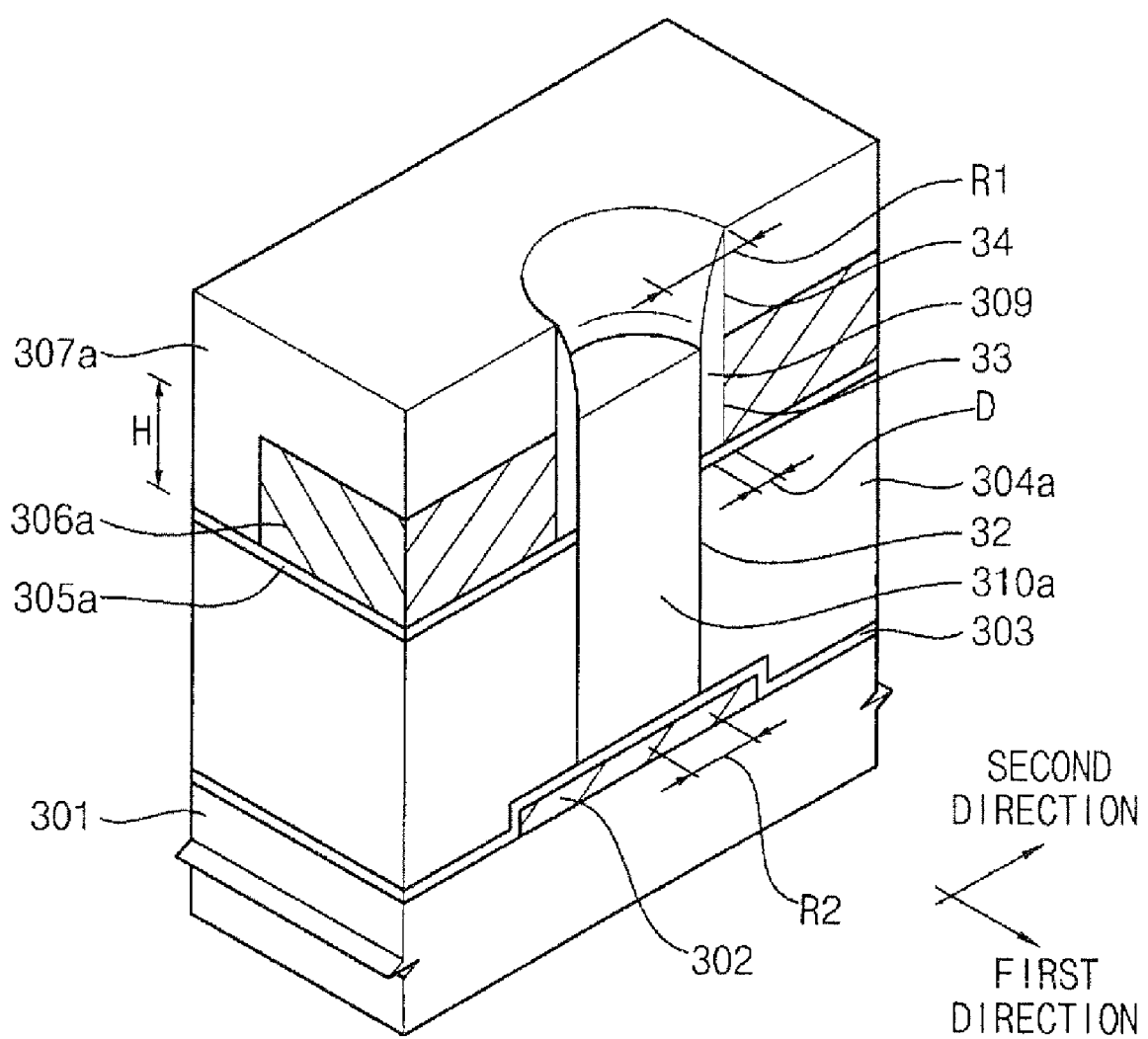

Referring to FIG. 31, an upper portion of the sacrificial layer 310 is removed to form a sacrificial filler 310a filling up at least the third hole 32. The sacrificial filler 310a may be formed by a chemical mechanical polishing (CMP) process, an etch-back process, or a combination process thereof. The sacrificial filler 310a may prevent or reduce damage to the first insulating layer pattern 304a (further, damage to the first etch-stop layer 303, the first conductive structure 302 and the seed layer) when the spacer 309 is removed in a successive process.

Figure 32:
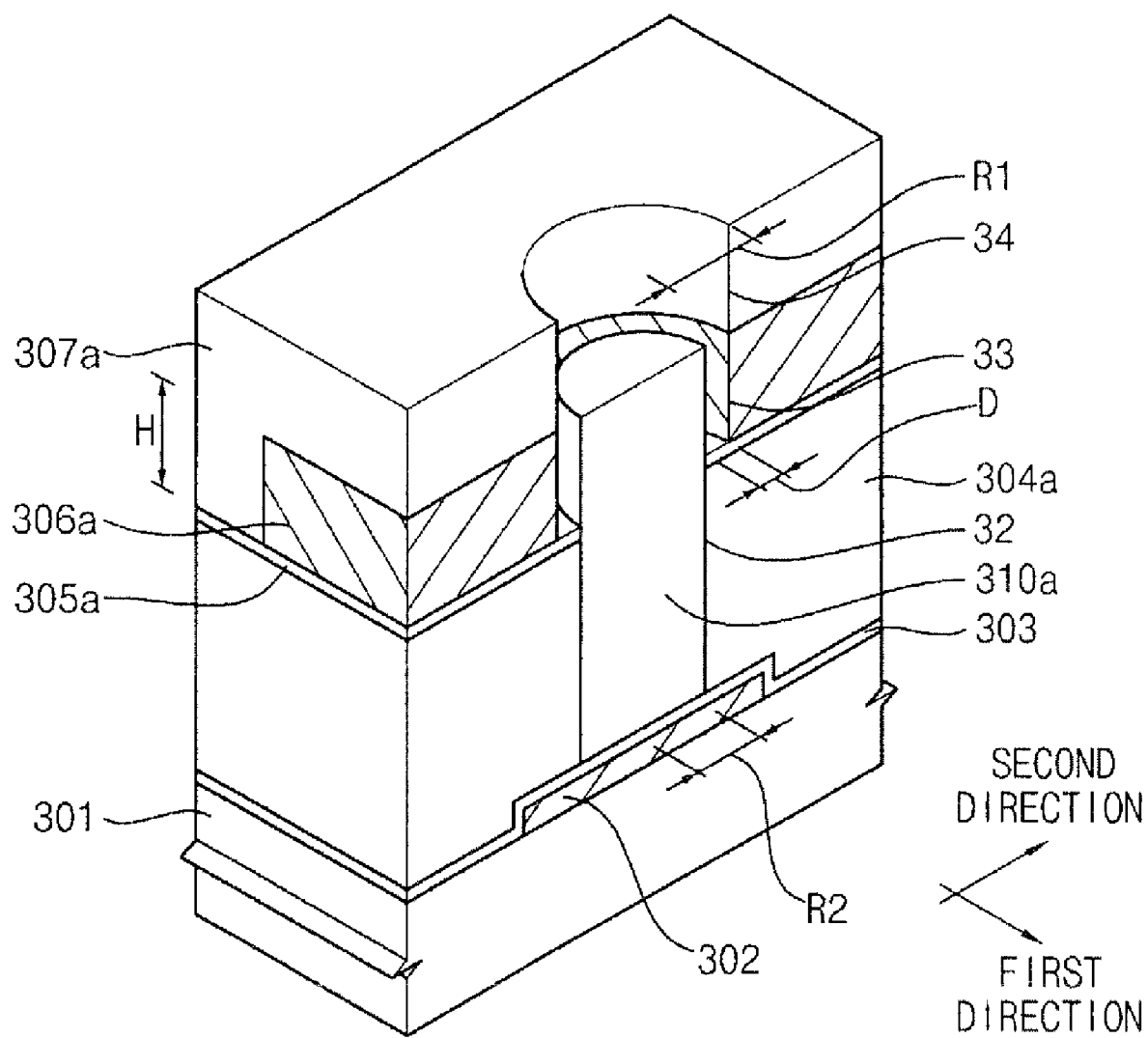

Referring to FIG. 32, the spacer 309 is removed to expose a portion of the second etch-stop layer pattern 305a covered by the spacer 309. The spacer 309 may be removed by a wet etching process using *Limulus Amebocyte* Lysate (LAL) solution as an etching solution. The spacer 309 may be removed without damaging the first insulating layer pattern 304a (further, the first etch-stop layer 303, the first conductive structure 302 and the seed layer) because the sacrificial filler 310a fills up at least the third hole 32.

Figure 33:
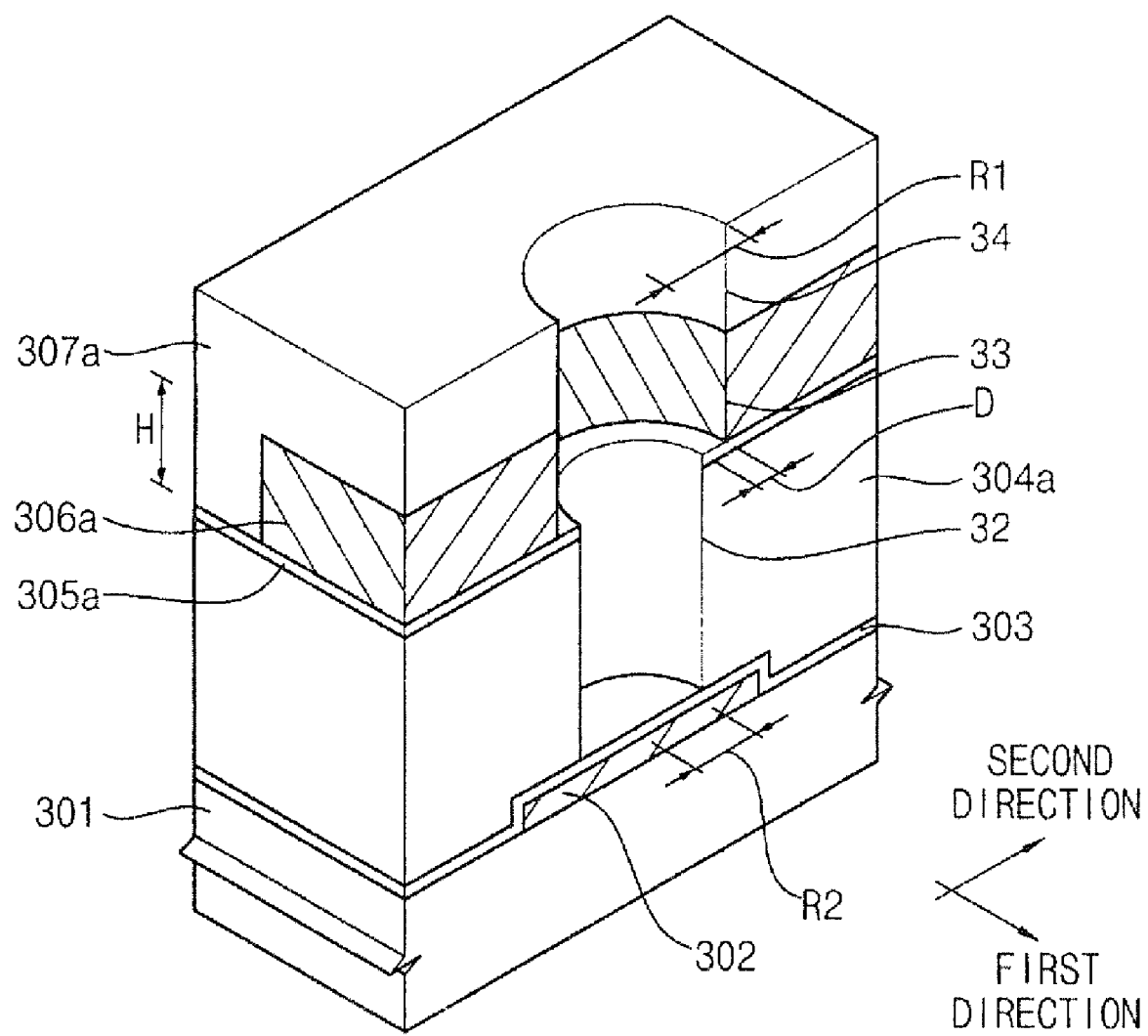

Referring to FIG. 33, the sacrificial filler 310a is removed to partially expose the first etch-stop layer 303. The sacrificial filler 310a may be removed by an ashing process and/or a stripping process. The sacrificial filler 310 may be removed without damaging the first conductive structure 302 (and the seed layer) because the first etch-stop layer 303 covers the first conductive structure 302.

Figure 34:
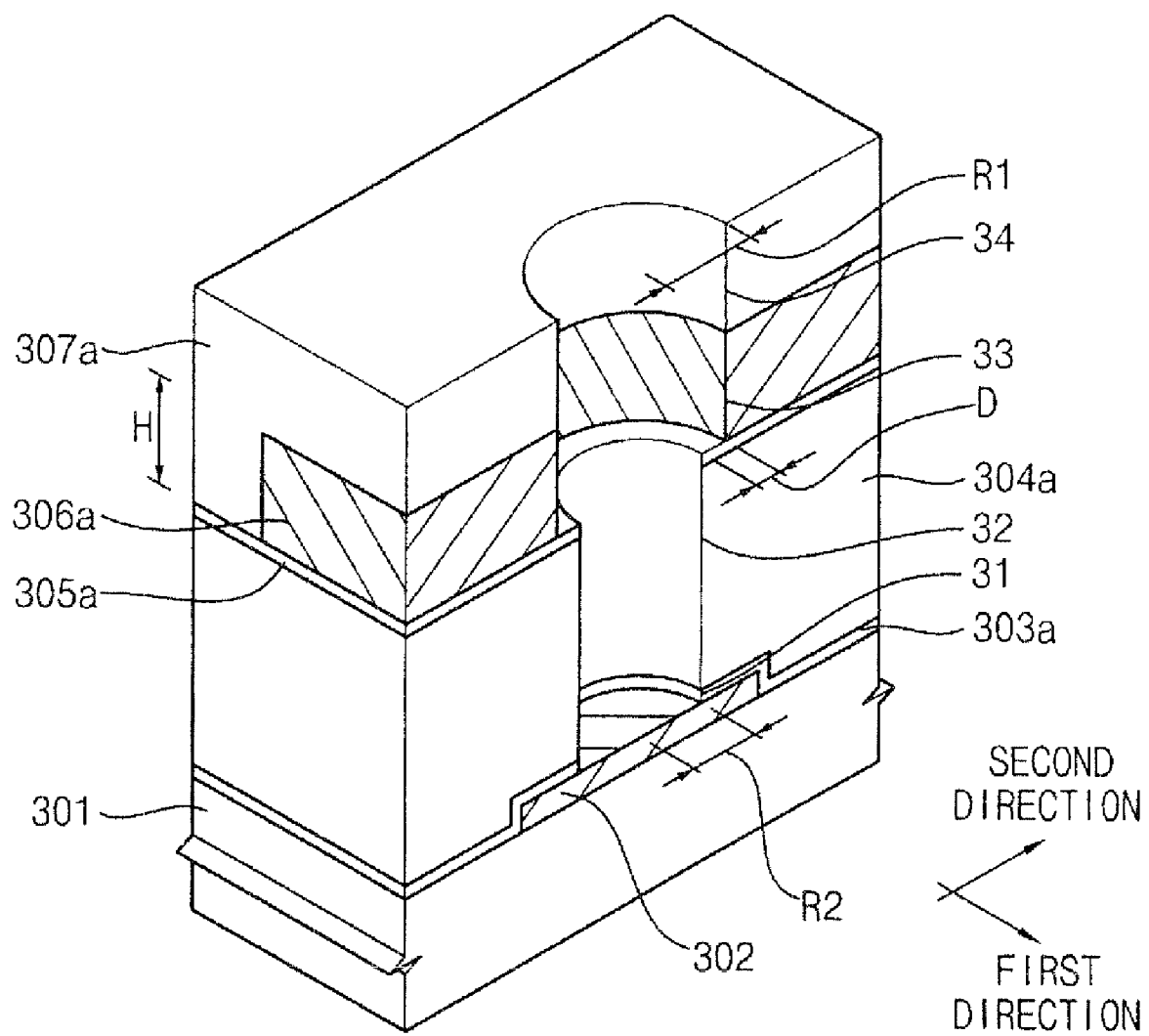

Referring to FIG. 34, the first etch-stop layer 303 is partially removed until the first conductive structure 302 is exposed, thereby forming a first etch-stop layer pattern 303a having the fourth hole 31. The fourth hole 31 may have the second radius R2, and expose a portion of the first conductive structure 302. The first etch-stop layer pattern 303a may be formed by an anisotropic etching process using the second etch-stop layer pattern 305a and the first insulating layer pattern 304a as an etch mask. The etching process may be performed using an etching gas that does not damage the seed layer on the first conductive structure 302 very much. When the first etch-stop layer 303 is formed using silicon nitride, the etching process may be performed using carbon tetrafluoride ($CF_4$), trifluoromethane ($CHF_3$), difluoromethane ($CH_2F_2$), etc., as an etching gas. As mentioned above the first etch-stop layer 305 has a relatively small thickness so that the first etch-stop layer 303 may be removed at a low power in the anisotropic etching process.

When the seed layer for growing the carbon nano-tube 315 is not formed on the first conductive structure 302 before the multilayer insulating layer is formed, the seed layer may be formed on the portion of the first conductive structure 302 exposed through the fourth hole 31.

Figure 35:
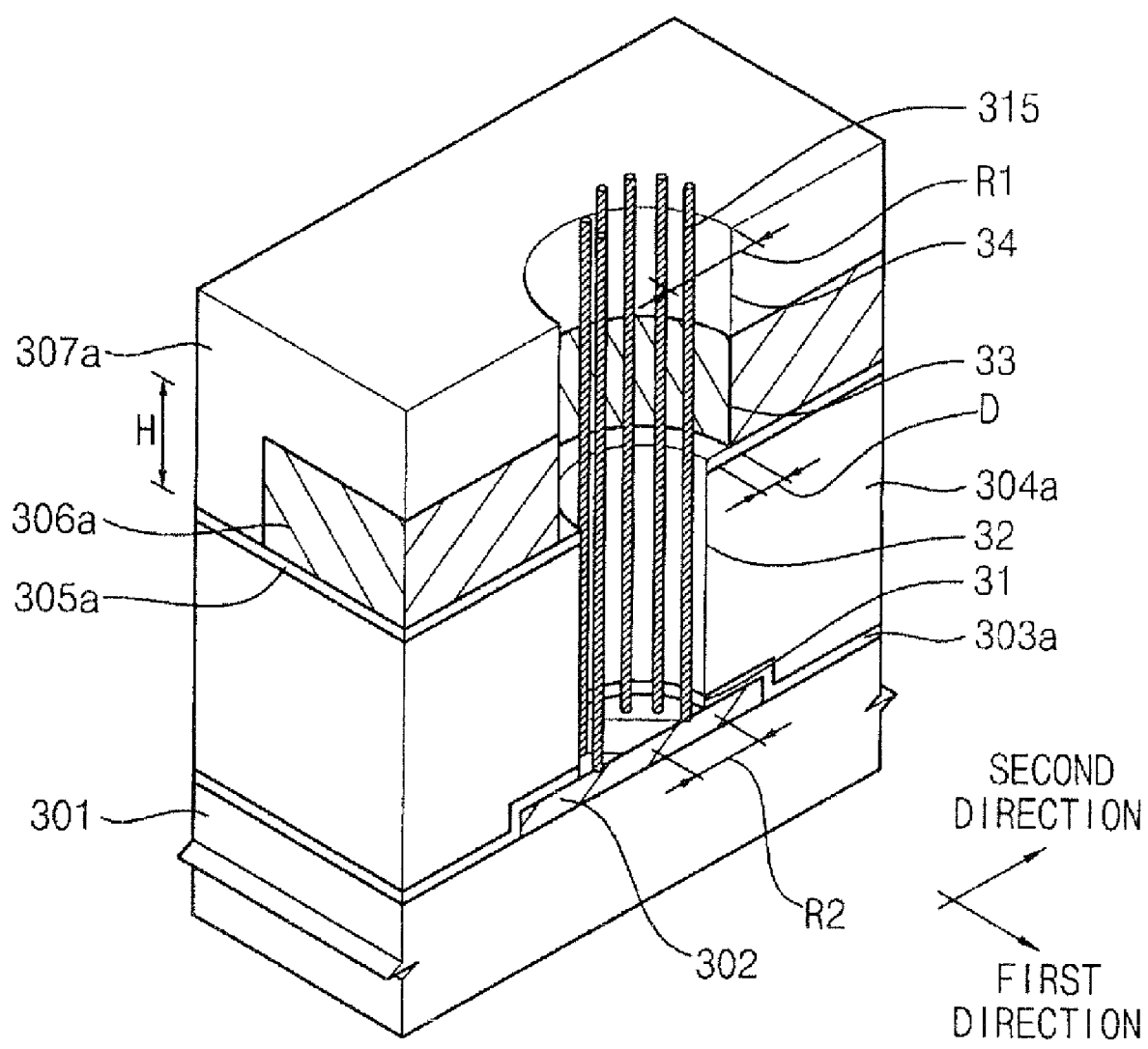

Referring to FIG. 35, at least one carbon nano-tube 315 vertically grows from the portion of the first conductive structure 302 exposed through the fourth hole 31. The carbon nano-tube 315 may be formed to have a height larger than that of the second insulating layer pattern 307a.

The carbon nano-tube 315 may be spaced apart from the second conductive structure pattern 306a by the width D of the lower end of the spacer 309, because the spacer 309 has been removed before the carbon nano-tube 315 grows.

Figure 36:
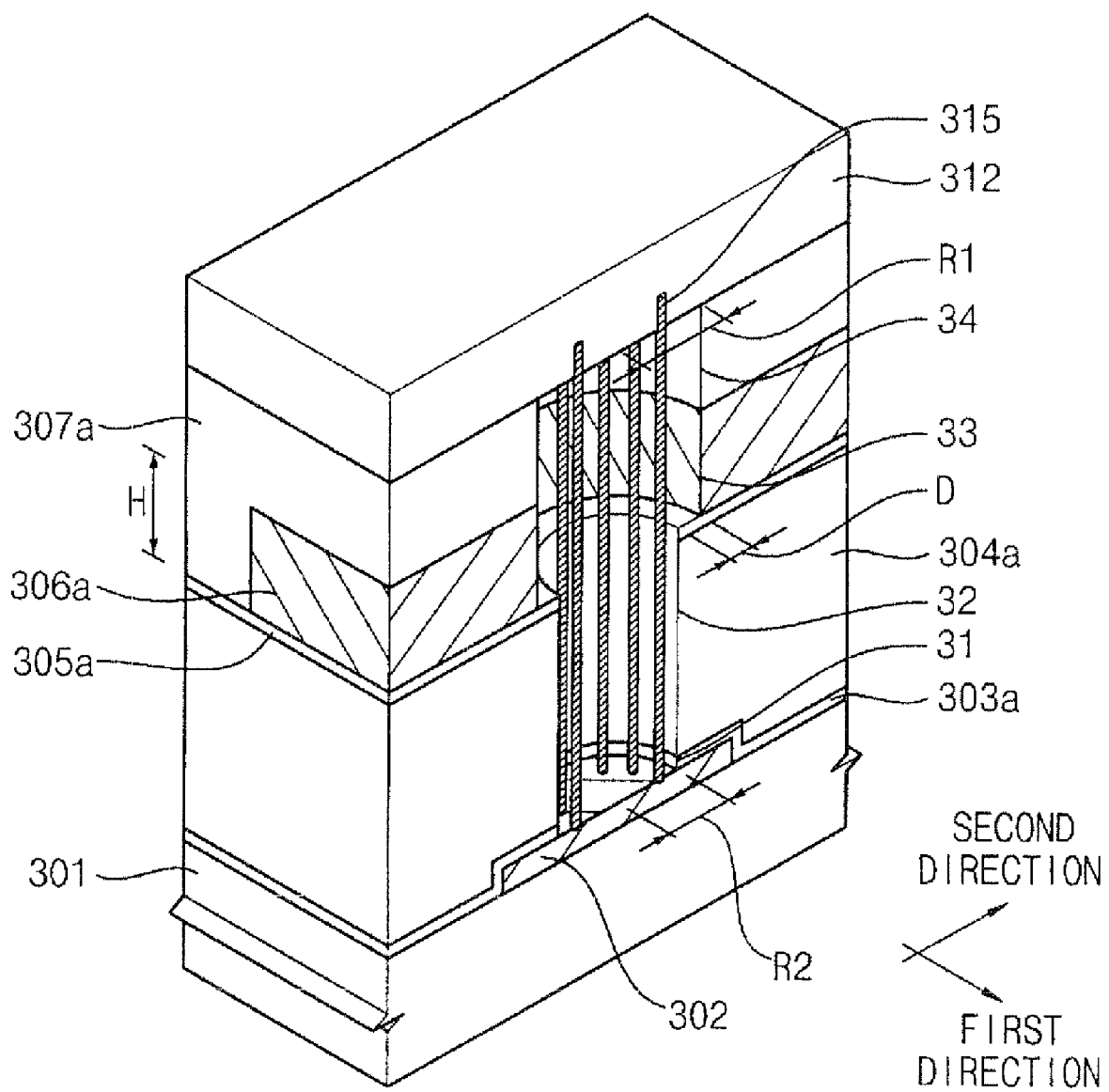

Referring to FIG. 36, a capping layer 312 may be formed on the second insulating layer pattern 307a so that the carbon nano-tube may be protected. The capping layer 312 may be formed using an insulating material. An upper end of the carbon nano-tube 315 may be fixed to the capping layer 312. Alternatively, the capping layer 312 may not be formed.

As illustrated above, in the present embodiment, the sacrificial filler 310a is formed on the first etch-stop layer 303 to fill up the third hole 32, and thus the spacer 309, which provides a space between the second conductive structure pattern 306a and the carbon nano-tube 315, may be easily removed without damaging the first conductive structure 302, the seed layer and the first insulating layer pattern 304a. Additionally, the multilayer insulating layer including the first and second etch-stop layers 303 and 305 are formed between the first conductive structure 302 and the second conductive structure pattern 306. Thus, the first insulating layer 304 may not be etched when the second conductive structure 306 is patterned, so that the first insulating layer pattern 304a may have the third hole 32 whose radius is substantially constant through the entire thickness of the first insulating layer pattern 304a.

Hereinafter, a method of manufacturing a transistor in accordance with an example embodiment of the present invention are illustrated with reference to FIGS. 37 to 40, which show partially cut perspective views. In the present embodiment, the method of manufacturing the transistor is substantially the same as that of FIGS. 24 to 36, except for the order of patterning a first etch-stop layer and forming a sacrificial filler. Thus, like reference numerals designate like elements throughout the drawings, and repetitive explanations on substantially the same processes as those in the previous embodiment are omitted here for simplicity.

Figure 37:
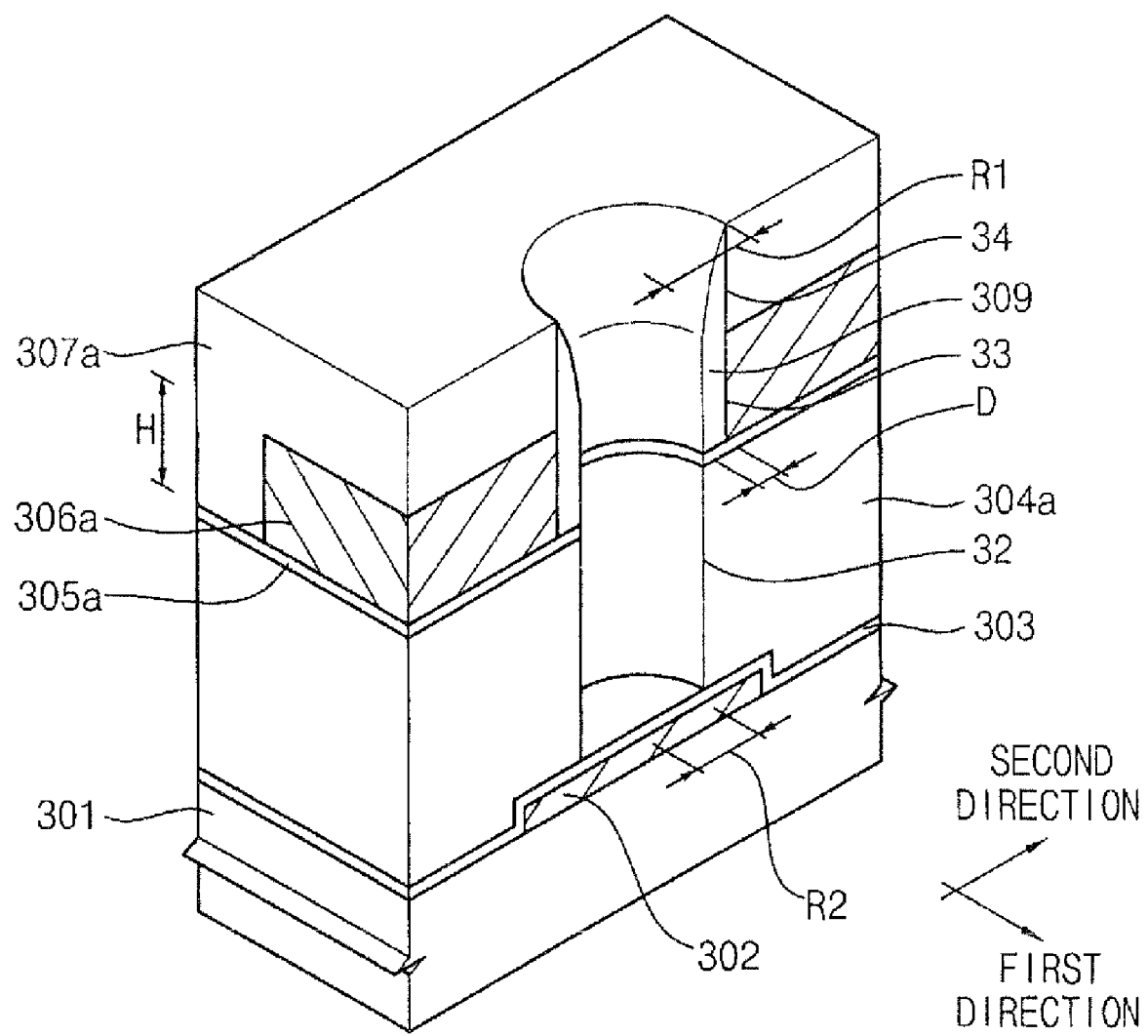
FIGS. 37 to 40 are partially cut perspective views illustrating a method of manufacturing a transistor in accordance with an example embodiment of the present invention.

Referring to FIG. 37, as illustrated in FIG. 29, a second etch-stop layer pattern 305a and a first insulating layer pattern 304a are formed on the first etch-stop layer 303. The second etch-stop layer pattern 305a together with the first insulating layer pattern 304a have a third hole 32. The third hole 32 may have a second radius R2 smaller than that of the first radius R1, and partially expose the first etch-stop layer 303. Particularly, the second radius R2 may be smaller than the first radius R1 by the width D of the lower end of the spacer 309.

Figure 38:
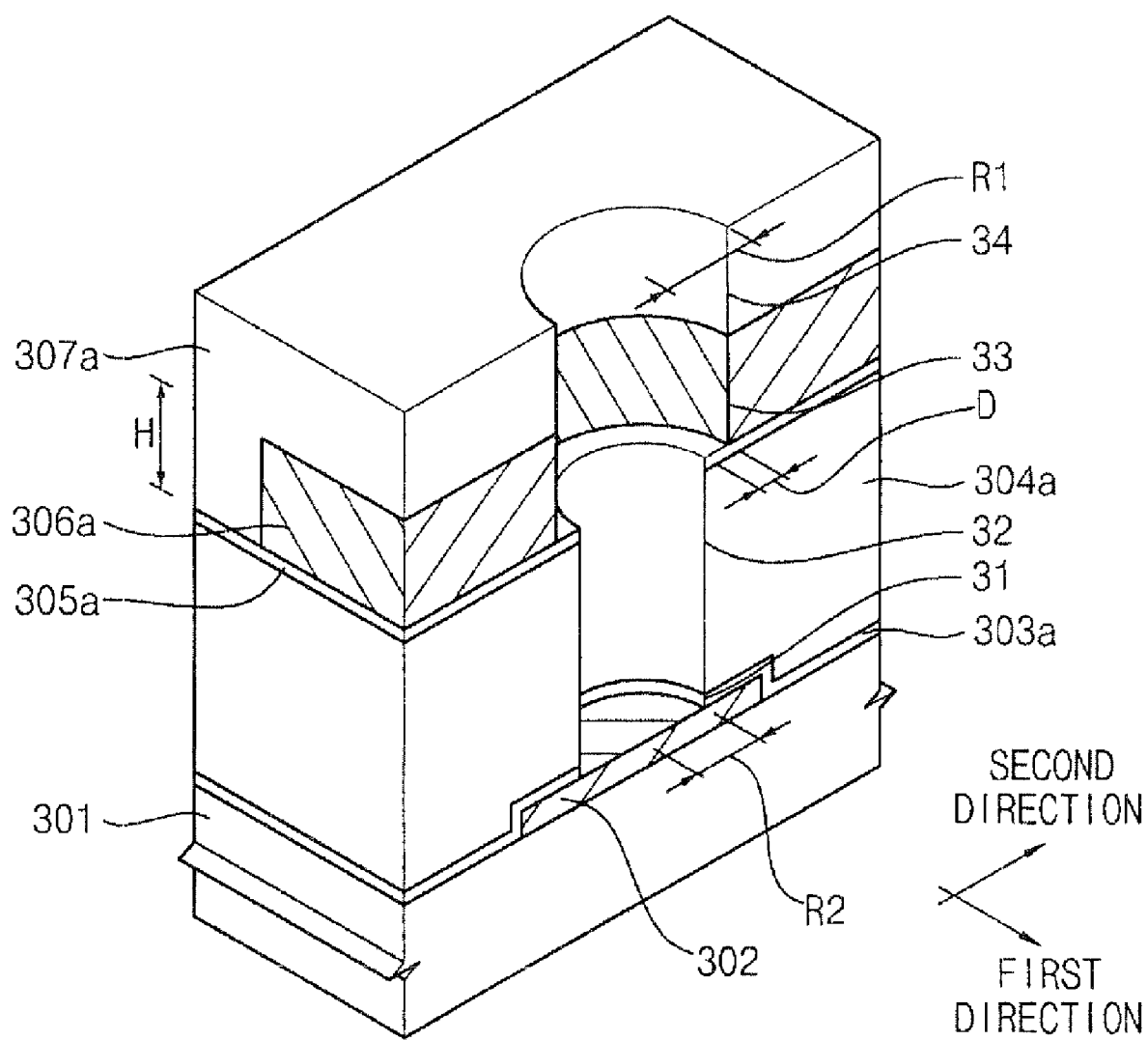

Referring to FIG. 38, the first etch-stop layer 303 is partially removed until the first conductive structure 302 is exposed, thereby forming a first etch-stop layer pattern 303a having a fourth hole 31. The fourth hole 31 may have the second radius R2, and expose a portion of the first conductive structure 302.

When the seed layer for growing a carbon nano-tube 315 (see FIG. 40) is not formed on the first conductive structure 302 before the multilayer insulating layer is formed, the seed layer may be formed on the portion of the first conductive structure 302 exposed through the fourth hole 31.

Figure 39:
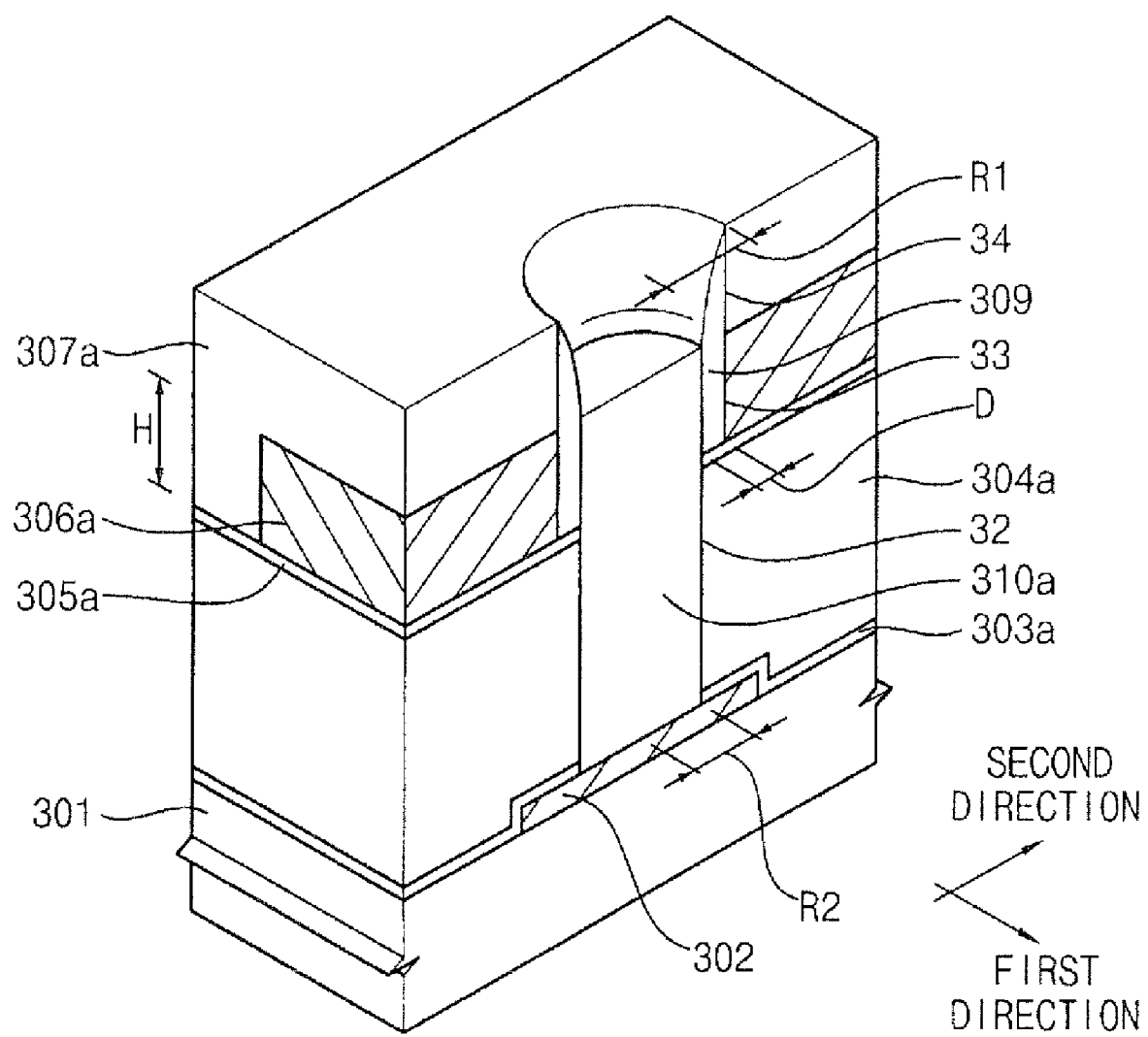

Referring to FIG. 39, a sacrificial layer is formed on the portion of the first conductive structure 302, the spacer 309 and the second insulating layer pattern 307a to fill up the third and fourth holes 32 and 31 and remaining portions of the first and second holes 34 and 33. The upper portion of the sacrificial layer is removed to form a sacrificial filler 310a filling up at least the fourth and third holes 32 and 31.

Figure 40:
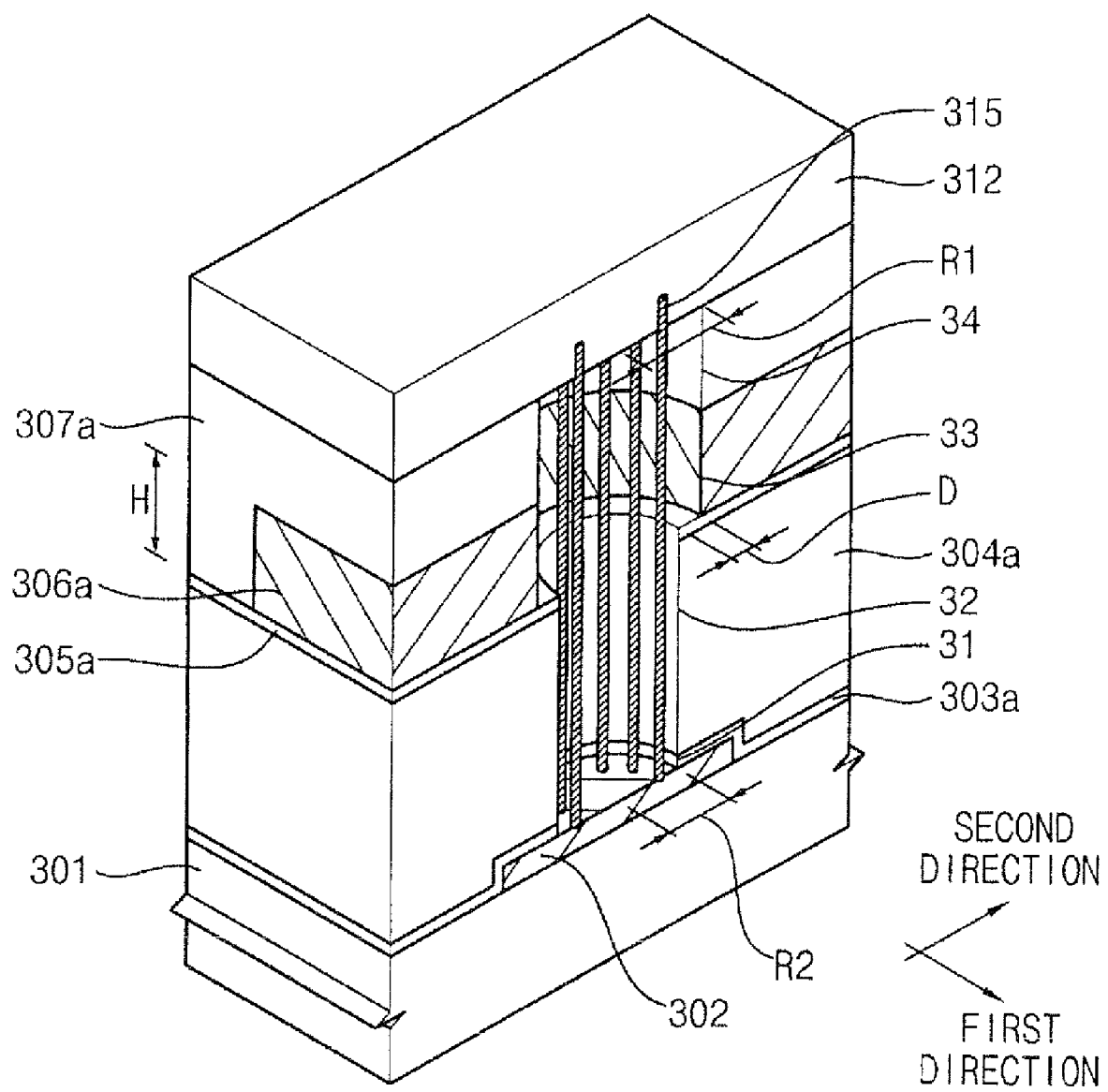

Referring to FIG. 40, the spacer 309 is removed to expose a portion of the second etch-stop layer pattern 305a covered by the spacer 309. The spacer 309 may be removed by a wet etching process using *Limulus Amebocyte* Lysate (LAL) solution as an etching solution. The spacer 309 may be removed without damaging the first insulating layer pattern 304a (further, the first conductive structure 302 and the seed layer) because the sacrificial filler 310a fills up at least the third and fourth holes 32 and 31.

The sacrificial filler 310a is removed to expose the portion of the first conductive structure 302. When the seed layer for growing the carbon nano-tube 315 is not formed on the first conductive structure 302 before the multilayer insulating layer is formed or after patterning the first etch-stop layer 303, the seed layer may be formed on the portion of the first conductive structure 302 exposed through the fourth hole 31.

At least one carbon nano-tube 315 vertically grows from the portion of the first conductive structure 302 exposed through the fourth hole 31. A capping layer 312 may be formed on the second insulating layer pattern 307a so that the carbon nano-tube may be protected.

As illustrated above, in the present embodiment, the sacrificial filler 310a is formed on the first conductive structure 302 to fill up the third and fourth holes 32 and 31, and thus the spacer 309, which provides a space between the second conductive structure pattern 306a and the carbon nano-tube 315, may be easily removed without damaging the first conductive structure 302, the seed layer and the first insulating layer pattern 304a. Additionally, the multilayer insulating layer including the first and second etch-stop layers 303 and 305 are formed between the first conductive structure 302 and the second conductive structure pattern 306. Thus, the first insulating layer 304 may not be etched when the second conductive structure 306 is patterned, so that the first insulating layer pattern 304a may have the third hole 32 whose radius is substantially constant through the entire thickness of the first insulating layer pattern 304a.

Hereinafter, a method of manufacturing a transistor in accordance with an example embodiment of the present invention are illustrated with reference to FIGS. 41 to 44, which show partially cut perspective views. In the present embodiment, the method of manufacturing the transistor is substantially the same as that of FIGS. 24 to 36, except for forming a sacrificial filler and a process for etching a spacer. Thus, like reference numerals designate like elements throughout the drawings, and repetitive explanations on substantially the same processes as those in the previous embodiment are omitted here for simplicity.

Figure 41:
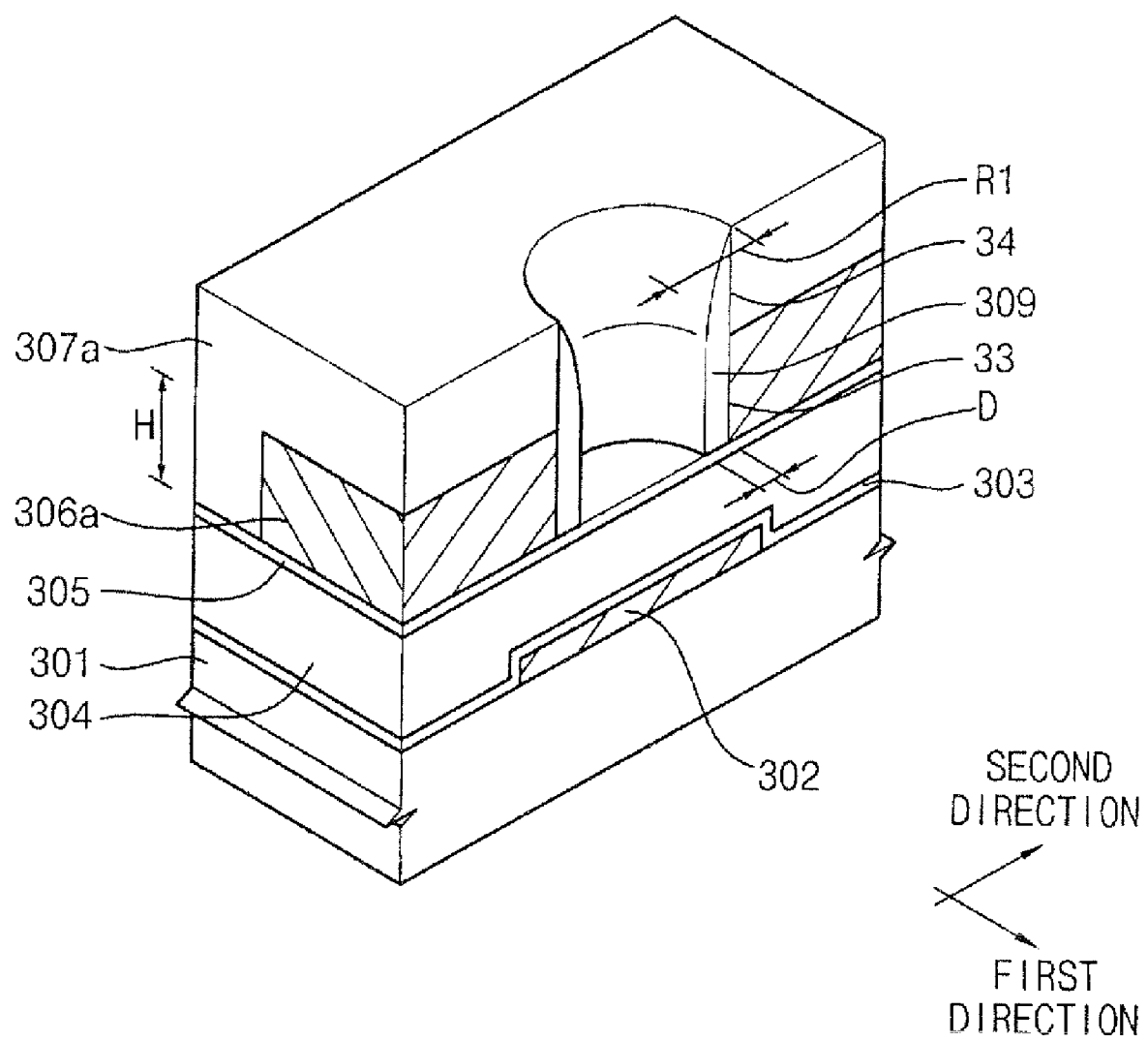
FIGS. 41 to 44 are partially cut perspective views illustrating a method of manufacturing a transistor in accordance with an example embodiment of the present invention.

Referring to FIG. 41, as illustrated in FIG. 28, a spacer layer is formed on the second etch-stop layer 305 and the second insulating layer pattern 307a to fill up the first and second holes 34 and 33. The spacer layer may be partially removed by an anisotropic etching process to form a spacer 309 on sidewalls of the first and second holes 34 and 33. The spacer 309 may partially cover the second etch-stop layer 305. A lower end of the spacer 309 may have a predetermined width D.

Figure 42:
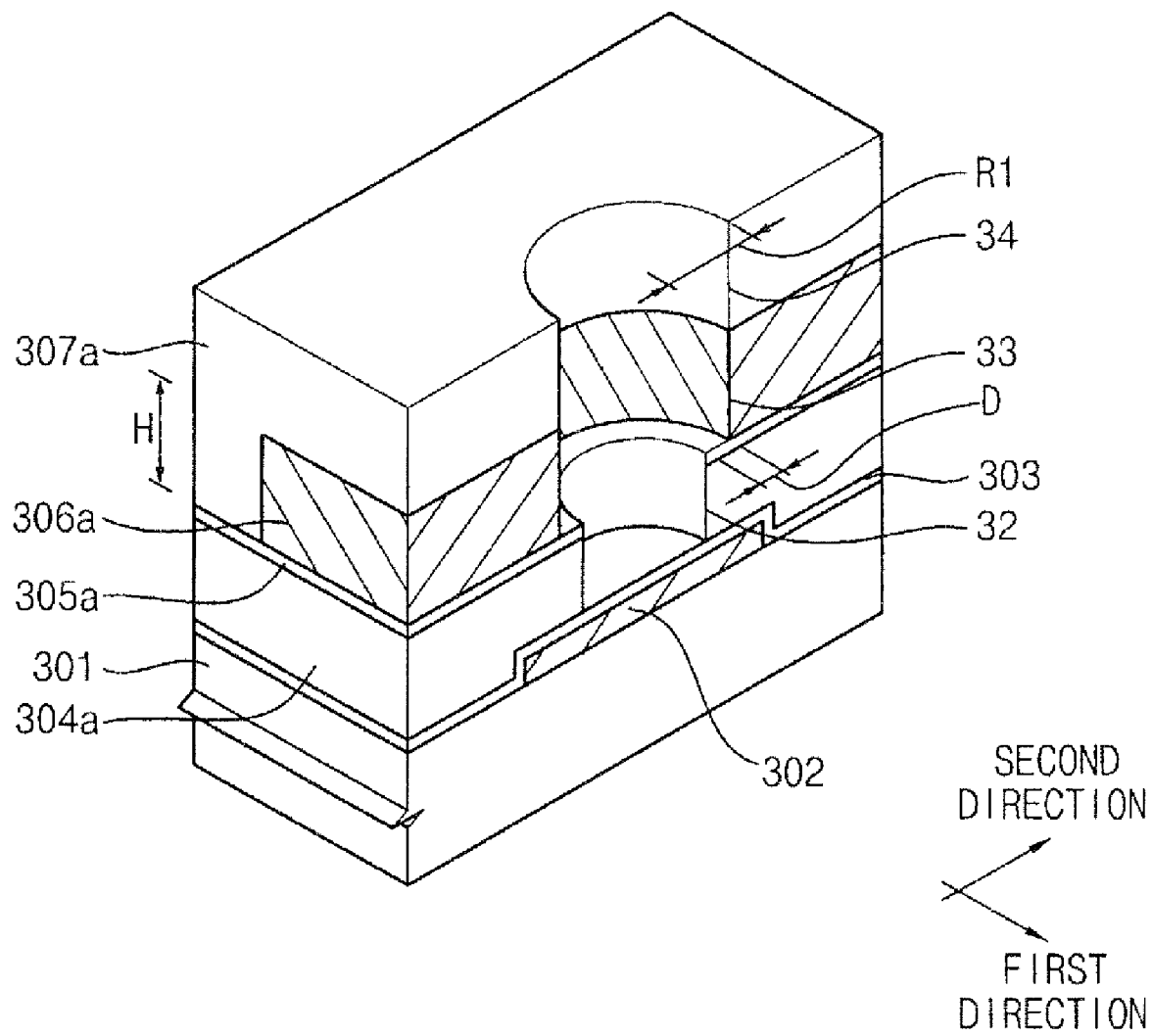

Referring to FIG. 42, the second etch-stop layer 305, the first insulating layer 304 and the spacer 309 are removed by an anisotropic etching process.

Particularly, the second etch-stop layer 305 is partially removed until the first insulating layer 304 is exposed, thereby forming a second etch-stop layer pattern 305a. The second etch-stop layer pattern 305a may be formed by a dry etching process using the spacer 309, the second insulating layer pattern 307a and the second conductive structure pattern 306a as an etch mask. When the second etch-stop layer 305 is formed using silicon nitride, the etching process may be performed using carbon tetrafluoride ($CF_4$), trifluoromethane ($CHF_3$), difluoromethane ($CH_2F_2$), etc., as an etching gas.

The first insulating layer 304 is partially removed until the first etch-stop layer 303 is exposed, thereby forming a first insulating layer pattern 304a. The first insulating layer pattern 304a may be formed by a dry etching process using the spacer 309, the second insulating layer pattern 307a, the second conductive structure pattern 306a and the first etch-stop layer pattern 305a as an etch mask. When the first insulating layer 304 is formed using silicon oxide, the etching process may be performed using $C_2F_6$, $C_3F_8$, $C_4F_6$, $C_4F_8$, $C_5F_8$, $C_6F_6$, etc., as an etching gas.

The second etch-stop layer pattern 305a together with the first insulating layer pattern 304a have a third hole 32 therethrough. The third hole 32 may nave a second radius R2 smaller than that of the first radius R1, and partially expose the first etch-stop layer 303. Particularly, the second radius R2 may be smaller than the first radius R1 by the width D of the lower end of the spacer 309.

The spacer 309 is removed until a portion of the second etch-stop layer pattern 305a covered by the spacer 309 is exposed. The spacer 309 may be removed by a dry etching process and the first conductive structure 302 is covered by the first etch-stop layer 303, so that the first conductive structure (and the seed layer) may not be damaged in the etching process.

When the spacer 309 is formed using a material substantially the same as that of the first insulating layer 304, e.g., silicon oxide, the spacer 309 and the first insulating layer 304 may be simultaneously removed in one dry etching process. In this case, the spacer 309 has been formed to have a thickness larger than that of the first insulating layer 304, so that the spacer 309 may serve as an etching mask for the first insulating layer 304 until the first etch-stop layer 303 is exposed.

When the second insulating layer pattern 307a is formed using a material substantially the same as that of the spacer 309, the second insulating layer pattern 307a may be removed in a dry etching process for removing the spacer 309. However, when the second insulating layer pattern 307a is formed using a material different from that of the spacer 309, the second insulating layer pattern 307a may not be removed in the dry etching process for removing the spacer 309.

Figure 43:
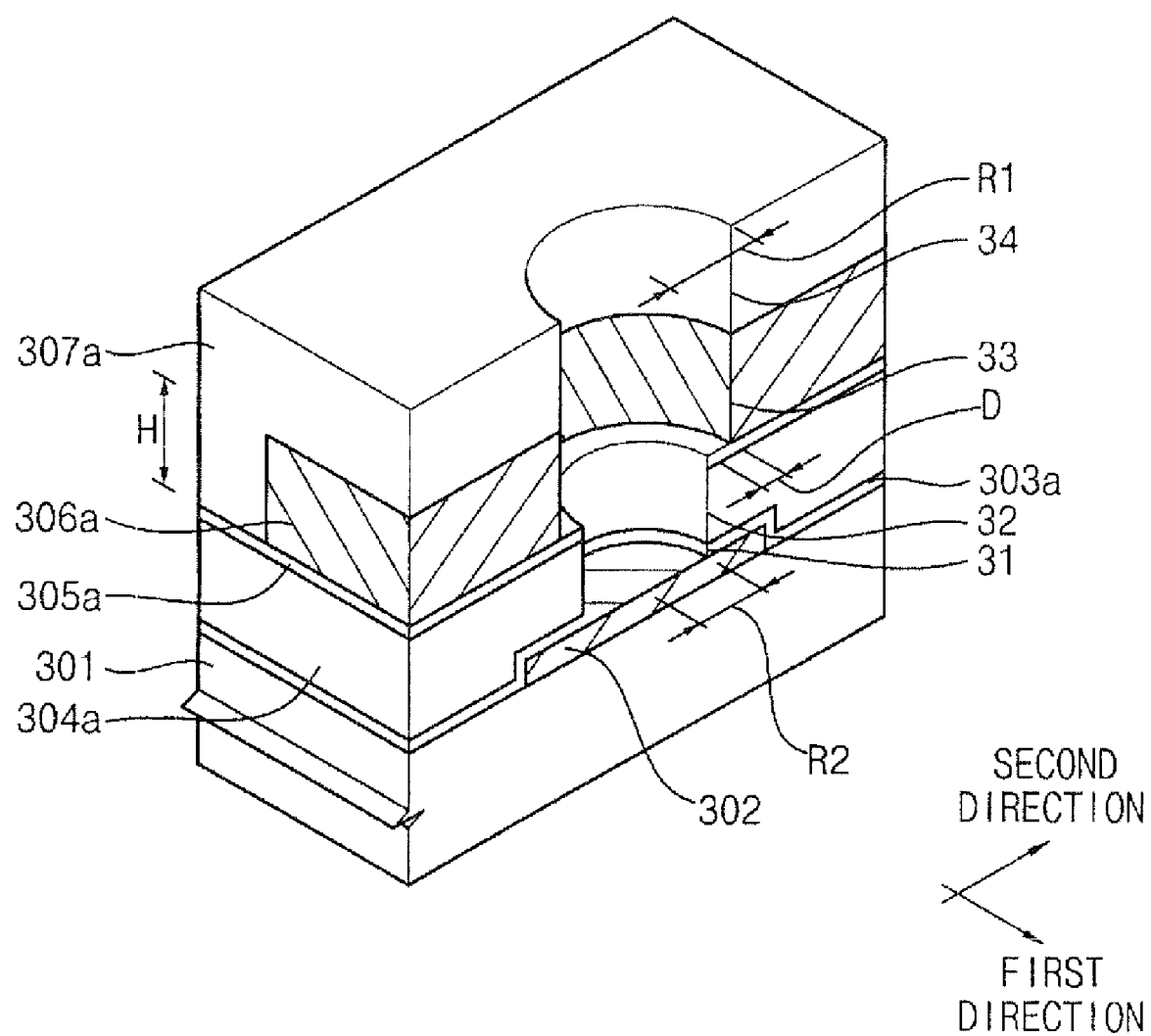

Referring to FIG. 43, the first etch-stop layer 303 is partially removed until the first conductive structure 302 is exposed, thereby forming a first etch-stop layer pattern 303a having a fourth hole 31. The fourth hole 31 may have the second radius R2, and expose a portion of the first conductive structure 302. When the seed layer for growing the carbon nano-tube 315 is not formed on the first conductive structure 302 before the multilayer insulating layer is formed, the seed layer may be formed on the portion of the first conductive structure 302 exposed through the fourth hole 31.

Figure 44:
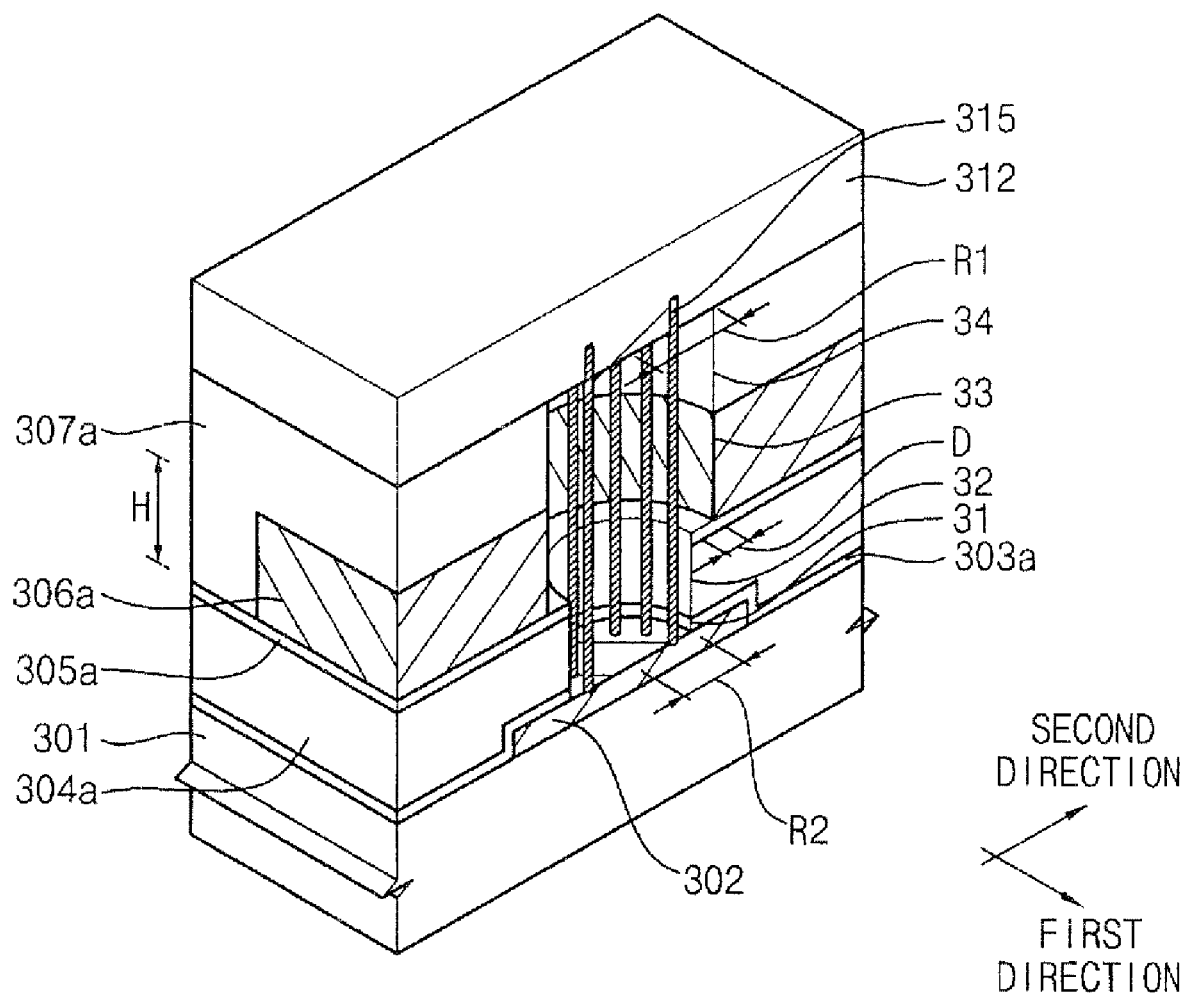

Referring to FIG. 44, at least one carbon nano-tube 315 vertically grows from the portion of the first conductive structure 302 exposed through the fourth hole 31. A capping layer 312 may be formed on the second insulating layer pattern 307a so that the carbon nano-tube may be protected.

As illustrated above, in the present embodiment, the spacer 309, which provides a space between the second conductive structure pattern 306a and the carbon nano-tube 315, is removed by a dry etch process, so that the spacer 309 may be easily removed without damaging the first conductive structure 302 and the seed layer. Additionally, the multilayer insulating layer including the first and second etch-stop layers 303 and 305 are formed between the first conductive structure 302 and the second conductive structure pattern 306. Thus, the first insulating layer 304 may not be etched when the second conductive structure 306 is patterned, so that the first insulating layer pattern 304a may have the third hole 32 whose radius is substantially constant through the entire thickness of the first insulating layer pattern 304a.

According to the present invention, a space between a carbon nano-tube and a conductor is formed by removing a spacer, so that process stability may be achieved. Additionally, a dimension of the spacer between the carbon nano-tube and the conductor may be efficiently controlled by adjusting a width of the spacer, so that an operation voltage relating to the dimension of the space may be efficiently controlled. Furthermore, the spacer may be easily removed without damaging other layers by forming a sacrificial filler.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a transistor, the method comprising:

forming a multilayer insulating structure on a first conductive structure, the multilayer insulating structure including a first etch-stop layer, a first insulating layer and a second etch-stop layer sequentially stacked on the first conductive structure;
forming a second conductive structure on the multilayer insulating structure;
forming a second insulating layer on the second conductive structure and the multilayer insulating structure;
etching the second insulating layer and the second conductive structure to form a second insulating layer pattern and a second conductive structure pattern, respectively, the second insulating layer pattern defining a first hole having a first radius, the second conductive structure pattern defining a second hole having the first radius;
forming a spacer on sidewalls of the first and second holes to partially cover the multilayer insulating structure;
etching the second etch-stop layer and the first insulating layer using the spacer as an etch mask to form a second etch-stop layer pattern and a first insulating layer pattern, respectively, the second etch-stop layer pattern together with the first insulating layer pattern defining a third hole communicating with the second hole, the third hole having a second radius substantially smaller than the first radius;
forming a sacrificial filler on the first etch-stop layer to fill up the third hole;
removing the spacer;
removing the sacrificial filler;
etching the first etch-stop layer to form a first etch-stop layer pattern defining a fourth hole communicating with the third hole, the fourth hole having the second radius; and
growing a carbon nano-tube from a portion of the first conductive structure exposed through the fourth hole.

2. The method of claim 1, wherein forming the sacrificial filler on the first etch-stop layer comprises:
forming a sacrificial layer on the first etch-stop layer, the spacer and the second insulating layer pattern to fill up the third hole and remaining portions of the first and second holes; and
removing an upper portion of the sacrificial layer to form the sacrificial filler.

3. The method of claim 2, wherein removing the upper portion of the sacrificial layer is performed by an etch-back process.

4. The method of claim 1, wherein the sacrificial filler is formed using a carbon-containing silicon oxide.

5. The method of claim 1, wherein the second etch-stop layer is formed using a material having an etching selectivity with respect to the second conductive structure, and the first etch-stop layer is formed using a material having an etching selectivity with respect to the first insulating layer.

6. The method of claim 5, wherein the second conductive structure is formed using titanium nitride and the second etch-stop layer is formed using aluminum oxide ($Al_2O_3$).

7. The method of claim 1, wherein the first and second etch-stop layers are formed using substantially the same material.

8. The method of claim 7, wherein the first and second etch-stop layers are formed using silicon nitride, and the first insulating layer is formed using silicon oxide.

9. The method of claim 1, wherein the first etch-stop layer is formed using silicon nitride, and wherein etching the first etch-stop layer is performed using any one selected from the group consisting of carbon tetrafluoride ($CF_4$), trifluoromethane ($CHF_3$), difluoromethane ($CH_2F_2$).

10. The method of claim 1, wherein forming the spacer on the sidewalls of the first and second holes comprises:
forming a spacer layer on the multilayer insulating structure and the second insulating layer pattern to fill up the first and second holes; and
anisotropically etching the spacer layer to form the spacer partially covering the multilayer insulating structure.

11. The method of claim 1, wherein removing the spacer are performed by a wet etching process using Limulus Amebocyte Lysate (LAL) solution.

12. The method of claim 1, further comprising forming a first seed layer for growing the carbon nano-tube on the first conductive structure, prior to forming the multilayer insulating structure on the first conductive structure.

13. The method of claim 1, further comprising forming a second seed layer for growing the carbon nano-tube on the portion of the first conductive structure after etching the first etch-stop layer.

14. The method of claim 1, further comprising forming a capping layer on the second insulating layer pattern to fix an upper end of the carbon nano-tube.

15. A method of manufacturing a transistor, the method comprising:
forming a multilayer insulating structure on a first conductive structure, the multilayer insulating structure including a first etch-stop layer, a first insulating layer and a second etch-stop layer sequentially stacked on the first conductive structure;
forming a second conductive structure on the multilayer insulating structure;
forming a second insulating layer on the second conductive structure and the multilayer insulating structure;
etching the second insulating layer and the second conductive structure to form a second insulating layer pattern and a second conductive structure pattern, respectively, the second insulating layer pattern defining a first hole having a first radius, the second conductive structure pattern defining a second hole having the first radius;
forming a spacer on sidewalls of the first and second holes to partially cover the multilayer insulating structure;
etching the second etch-stop layer and the first insulating layer using the spacer as an etch mask to form a second etch-stop layer pattern and a first insulating layer pattern, respectively, the second etch-stop layer pattern together with the first insulating layer pattern defining a third hole communicating with the second hole, the third hole having a second radius substantially smaller than the first radius;
etching the first etch-stop layer to form a first etch-stop layer pattern defining a fourth hole communicating with the third hole, the fourth hole having the second radius;
forming a sacrificial filler on the first conductive structure to fill up the third and fourth holes;
removing the spacer;
removing the sacrificial filler; and
growing a carbon nano-tube from a portion of the first conductive structure exposed through the fourth hole.

16. The method of claim 15, wherein forming the sacrificial filler on the first conductive structure comprises:
forming a sacrificial layer on the first conductive structure, the spacer and the second insulating layer pattern to fill up the third and fourth holes and remaining portions of the first and second holes; and
removing an upper portion of the sacrificial layer to form the sacrificial filler.

17. A method of manufacturing a transistor, the method comprising:

forming a multilayer insulating structure on a first conductive structure, the multilayer insulating structure including a first etch-stop layer, a first insulating layer and a second etch-stop layer sequentially stacked on the first conductive structure;

forming a second conductive structure on the multilayer insulating structure;

forming a second insulating layer on the second conductive structure and the multilayer insulating structure;

etching the second insulating layer and the second conductive structure to form a second insulating layer pattern and a second conductive structure pattern, respectively, the second insulating layer pattern defining a first hole having a first radius, the second conductive structure pattern defining a second hole having the first radius;

forming a spacer on sidewalls of the first and second holes to partially cover the multilayer insulating structure;

removing portions of the second etch-stop layer and the first insulating layer that are not covered by the spacer until the first etch-stop layer is exposed, thereby forming a second etch-stop layer pattern and a first insulating layer pattern, respectively, and removing the spacer until a portion of the second etch-stop layer pattern is exposed, the second etch-stop layer pattern together with the first insulating layer pattern defining a third hole communicating with the second hole, the third hole having a second radius substantially smaller than the first radius;

etching the first etch-stop layer to form a first etch-stop layer pattern defining a fourth hole communicating with the third hole, the fourth hole having the second radius; and growing a carbon nano-tube from a portion of the first conductive structure exposed through the fourth hole.

18. The method of claim 17, wherein removing the portions of the second etch-stop layer and the first insulating layer and removing the spacer are performed by a dry etching process.

19. The method of claim 17, wherein the spacer is formed using a material different from that of the second insulating layer.

20. The method of claim 17, wherein the spacer is formed using silicon oxide and the second insulating layer is formed using silicon nitride.

* * * * *

UNITED STATES PATENT AND TRADEMARK OFFICE
CERTIFICATE OF CORRECTION

| | |
|---|---|
| PATENT NO. | : 7,585,718 B2 |
| APPLICATION NO. | : 11/932994 |
| DATED | : September 8, 2009 |
| INVENTOR(S) | : Hong Cho et al. |

It is certified that error appears in the above-identified patent and that said Letters Patent is hereby corrected as shown below:

Column 12, line 53, the word "23," should read -- 23. --;
Column 17, line 22, the word "above" should read -- above, --;
Column 19, line 50, the word "nave" should read -- have --.

Signed and Sealed this

Fifteenth Day of December, 2009

David J. Kappos
*Director of the United States Patent and Trademark Office*